United States Patent
Okamoto et al.

(10) Patent No.: US 8,791,465 B2
(45) Date of Patent: Jul. 29, 2014

(54) COMPOUND SEMICONDUCTOR DEVICE AND MANUFACTURING THEREFOR

(75) Inventors: Naoya Okamoto, Isehara (JP); Kozo Makiyama, Kawasaki (JP); Toshihiro Ohki, Hadano (JP); Yuichi Minoura, Zama (JP); Shirou Ozaki, Yamato (JP); Toyoo Miyajima, Isehara (JP)

(73) Assignee: Fujitsu Limited, Kawasaki (JP)

( * ) Notice: Subject to any disclaimer, the term of this patent is extended or adjusted under 35 U.S.C. 154(b) by 48 days.

(21) Appl. No.: 13/549,655

(22) Filed: Jul. 16, 2012

(65) Prior Publication Data

US 2013/0082307 A1  Apr. 4, 2013

(30) Foreign Application Priority Data

Sep. 29, 2011 (JP) ................................. 2011-215197

(51) Int. Cl.
| | | |
|---|---|---|
| H01L 21/48 | (2006.01) | |
| H01L 21/285 | (2006.01) | |
| H01L 29/423 | (2006.01) | |
| H01L 29/47 | (2006.01) | |
| H01L 29/872 | (2006.01) | |
| H01L 29/778 | (2006.01) | |
| H01L 29/20 | (2006.01) | |
| H01L 29/43 | (2006.01) | |
| H01L 23/31 | (2006.01) | |
| H01L 23/29 | (2006.01) | |

(52) U.S. Cl.
CPC ......... *H01L 29/7787* (2013.01); *H01L 29/2003* (2013.01); *H01L 29/432* (2013.01); *H01L 23/3171* (2013.01); *H01L 21/28581* (2013.01); *H01L 29/42316* (2013.01); *H01L 29/475* (2013.01); *H01L 2924/0002* (2013.01); *H01L 29/872* (2013.01); *H01L 23/291* (2013.01)

USPC ...... 257/76; 257/192; 257/194; 257/E21.403; 257/E29.246; 257/E31.001

(58) Field of Classification Search
CPC ............ H01L 29/0843; H01L 29/7787; H01L 29/42316; H01L 29/66462; H01L 29/41766; H01L 21/02395; H01L 21/02463; H01L 21/02505; H01L 21/02543; H01L 21/02546; H01L 29/66318; H01L 21/02579; H01L 21/0262; H01L 21/02631; H01L 27/0605; H01L 29/207; H01L 21/02573
USPC ............... 257/76, 191–194, E21.403, 29.246, 257/253, 31.001, 33.037, 27.068
See application file for complete search history.

(56) References Cited

U.S. PATENT DOCUMENTS

| | | | | |
|---|---|---|---|---|
| 4,663,643 | A | * | 5/1987 | Mimura ........................ 257/195 |
| 5,479,028 | A | * | 12/1995 | Tomioka et al. ................ 257/76 |

(Continued)

FOREIGN PATENT DOCUMENTS

EP  1791173  5/2007

OTHER PUBLICATIONS

D. Song, et al.; "Normally Off AlGaN/GaN Low-Density Drain HEMT (LDD-HEMT) With Enhanced Breakdown Voltage and Reduced Current Collapse;" IEEE Electron Device Letters; vol. 28; No. 3; Mar. 2007; pp. 189-191 (3 Sheets)/p. 2 of specification.

(Continued)

*Primary Examiner* — Michael Lebentritt
(74) *Attorney, Agent, or Firm* — Kratz, Quintos & Hanson, LLP

(57) ABSTRACT

A compound semiconductor device includes a compound semiconductor laminated structure, a passivation film formed on the compound semiconductor laminated structure and having a through-hole, and a gate electrode formed on the passivation film so as to plug the through-hole. A grain boundary between different crystalline orientations is formed in the gate electrode, and a starting point of the grain boundary is located apart from the through-hole on a flat surface of the passivation film.

8 Claims, 21 Drawing Sheets

(56) References Cited

U.S. PATENT DOCUMENTS

| | | | |
|---|---|---|---|
| 5,739,558 A * | 4/1998 | Ishida et al. | 257/192 |
| 7,247,889 B2 * | 7/2007 | Hanson et al. | 257/189 |
| 8,198,633 B2 * | 6/2012 | Griebenow et al. | 257/66 |
| 2002/0052098 A1 | 5/2002 | Chang | |
| 2007/0164321 A1 | 7/2007 | Sheppard et al. | |
| 2007/0228416 A1 * | 10/2007 | Chen et al. | 257/192 |
| 2009/0140262 A1 * | 6/2009 | Ohki et al. | 257/76 |
| 2009/0146191 A1 | 6/2009 | Green et al. | |
| 2011/0284865 A1 * | 11/2011 | Inoue et al. | 257/76 |
| 2014/0001478 A1 * | 1/2014 | Saunier et al. | 257/76 |

OTHER PUBLICATIONS

Extended European Search Report dated Feb. 17, 2014 issued in counterpart application No. 12176977.2.

* cited by examiner

COMPOUND SEMICONDUCTOR DEVICE AND MANUFACTURING THEREFOR

CROSS-REFERENCE TO RELATED APPLICATION

This application is based upon and claims the benefit of priority of the prior Japanese Patent Application No. 2011-215197, filed on Sep. 29, 2011, the entire contents of which are incorporated herein by reference.

FIELD

Embodiments relate to a compound semiconductor device and a manufacturing method for the compound semiconductor device.

BACKGROUND

The idea of applying a nitride semiconductor to a high-voltage, high-power semiconductor device by taking advantage of features such as a high saturated electron velocity and a wide band gap is under consideration. For example, GaN that is a nitride semiconductor has a band gap of 3.4 eV larger than the band gap (1.1 eV) of Si and the band gap (1.4 eV) of GaAs and has a high breakdown electric field strength. For this reason, GaN is a very promising material for a power semiconductor device for high-voltage operation and high power.

Semiconductor devices using a nitride semiconductor include field-effect transistors. There have been numerous reports on field-effect transistors, particularly high electron mobility transistors (HEMTs). For example, among GaN-based HEMTs (GaN HEMTs), an AlGaN/GaN HEMT using GaN in an electron transit layer and AlGaN in an electron supply layer is attracting attention. In an AlGaN/GaN HEMT, distortion occurs in AlGaN due to the difference in lattice constants between GaN and AlGaN. Piezoelectric polarization resulting from the distortion and spontaneous polarization of AlGaN lead to formation of a high concentration of two-dimensional electron gas (2DEG). Accordingly, an AlGaN/GaN HEMT is expected to serve as a high-efficiency switching device or a high-voltage power device for an electric vehicle or the like.

[Non Patent Document 1] D. Song et al., *IEEE Electron Device Lett.*, Vol. 28, No. 3, pp. 189-191, 2007

An electrode of a semiconductor device using a nitride semiconductor (e.g., a gate electrode of a GaN-HEMT) uses a laminated structure of nickel (Ni) and gold (Au). Ni is a metal having a relatively high melting point, and a favorable Schottky barrier is formed between Ni and GaN. Ni also has high resistivity. The structure in which Au having low resistivity is deposited on Ni lowers the resistance of the gate electrode and prevents deterioration in high-frequency characteristics. Generally, a gate electrode has a so-called overhang structure to reduce electric field concentration on its edge, i.e., plugs a through-hole formed in an insulating film (passivation film) which protects a surface of a nitride semiconductor with a gate material and overhangs the passivation film. In this case, a film of Ni formed on monocrystals of the nitride semiconductor is affected by the crystal structure of the underlying layer and has a face-centered cubic structure (fcc) (111) orientation. A film of Ni formed on the passivation film is affected by the amorphous structure of the underlying layer and has a random orientation. For this reason, a very large grain boundary is formed between the Ni having the fcc (111) orientation and the Ni having a random orientation.

Additionally, an interface (sidewall interface) between Ni and a sidewall of the through-hole in the passivation film is likely to split open due to thermal stress or the like.

If the GaN-HEMT with the above-described structure is electrified at a high temperature, Au of the gate electrode passes through a large grain boundary and a sidewall interface and reaches a nitride semiconductor surface (Schottky surface) to react with the nitride semiconductor surface. This deteriorates gate characteristics and lowers the reliability of the GaN-HEMT.

SUMMARY

An embodiment of a compound semiconductor device includes a compound semiconductor layer, an insulating film formed on the compound semiconductor layer and having a through-hole, and an electrode formed on the insulating film so as to plug the through-hole. A grain boundary between different crystalline orientations is formed in the electrode, and an end of the grain boundary is spaced apart from the through-hole on a flat surface of the insulating film.

An embodiment of a method for manufacturing a compound semiconductor device includes forming an insulating film on a compound semiconductor layer, forming a through-hole in a predetermined area of the insulating film by dry etching using a predetermined mask, removing the mask, and wet-etching the insulating film.

An embodiment of a method for manufacturing a compound semiconductor device includes forming an insulating film on a compound semiconductor layer, forming, on the insulating film, a protective film made of a material having a wet etching rate higher than a wet etching rate of the insulating film, and forming a through-hole in a predetermined area of the insulating film by wet etching.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Specific embodiments of a method for manufacturing a compound semiconductor device will be described below in detail with reference to the drawings. Note that the thickness of a component or the like is drawn so as to have a value different from its actual value for ease of understanding in predetermined ones of the drawings.

First Embodiment

The present embodiment discloses an AlGaN/GaN HEMT of a nitride semiconductor as a compound semiconductor device.

FIGS. 1A to 3C are schematic sectional views illustrating, in the order of steps, a method for manufacturing an AlGaN/GaN HEMT according to the first embodiment.

Figure 1A:
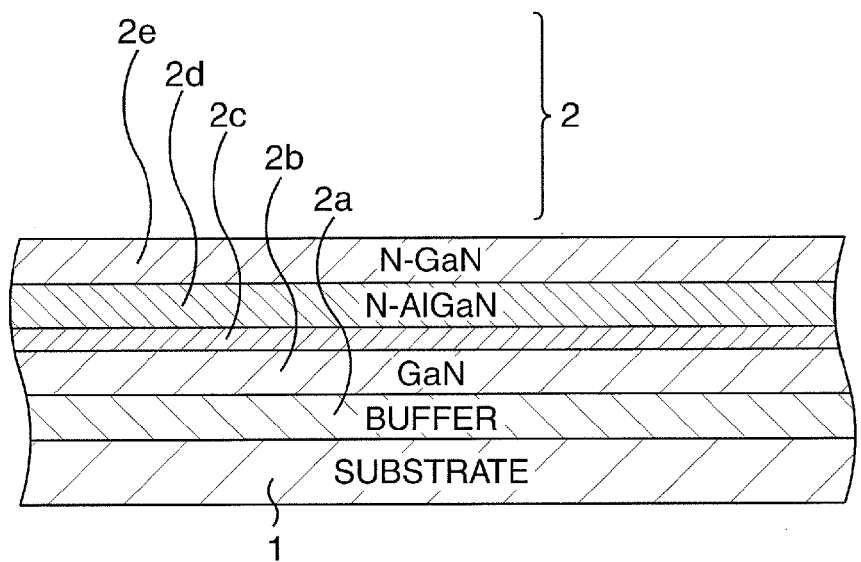
FIGS. 1A to 1C are schematic sectional views illustrating, in the order of steps, a method for manufacturing an AlGaN/GaN HEMT according to a first embodiment.

As illustrated in FIG. 1A, a compound semiconductor laminated structure 2 is first formed on, for example, a semi-insulating SiC substrate 1 as a growth substrate. As the growth substrate, an Si substrate, a sapphire substrate, a GaAs substrate, a GaN substrate, or the like may be used instead of an SiC substrate. The substrate may be semi-insulating or conductive.

The compound semiconductor laminated structure 2 includes a buffer layer 2a, an electron transit layer 2b, an intermediate layer 2c, an electron supply layer 2d, and a cap layer 2e.

In a completed AlGaN/GaN HEMT, two-dimensional electron gas (2DEG) is generated near an interface between the electron transit layer 2b and the electron supply layer 2d (the intermediate layer 2c to be exact) during operation. The generation of the 2DEG is based on piezoelectric polarization resulting from distortion caused by the difference in lattice constant between a compound semiconductor (GaN in the present embodiment) of the electron transit layer 2b and a compound semiconductor (AlGaN in the present embodiment) of the electron supply layer 2d combined with spontaneous polarization of the electron transit layer 2b and electron supply layer 2d.

More specifically, the compound semiconductors below are grown on the SiC substrate 1 by, e.g., metal organic vapor phase epitaxy (MOVPE). Molecular beam epitaxy (MBE) or the like may be used instead of MOVPE.

AlN with a thickness of about 5 nm, i-GaN (intentionally undoped GaN) with a thickness of about 1 μm, i-AlGaN with a thickness of about 5 nm, n-AlGaN with a thickness of about 30 nm, and n-GaN with a thickness of about 3 nm are grown in order on the SiC substrate 1. With this process, the buffer layer 2a, electron transit layer 2b, intermediate layer 2c, electron supply layer 2d, and cap layer 2e are formed. As the buffer layer 2a, AlGaN may be used instead of AlN or GaN may be grown by low temperature growth.

The growth conditions for AlN, GaN, and AlGaN are that a gaseous mixture of trimethyl aluminum gas, trimethyl gallium gas, and ammonia gas is used as a source gas, that whether to supply trimethyl aluminum gas as an Al source and trimethyl gallium gas as a Ga source and the flow rates of the gases are appropriately set according to a compound semiconductor layer to be grown, that the flow rates of ammonia gas as a common material are about 100 sccm to 10 slm, that the growth pressures for AlN, GaN, and AlGaN are about 50 to 300 Torr, and that the growth temperatures are about 1000 to 1200° C.

When GaN (or AlGaN) is to be grown as n-type, for example, $SiH_4$ gas containing an n-type impurity such as Si is added to a source gas at a predetermined flow rate, and GaN (or AlGaN) is doped with Si. The doping concentrations of Si are set to about $1\times10^{18}/cm^3$ to $1\times10^{20}/cm^3$ (e.g., $5\times10^{18}/cm^3$).

Figure 1B:
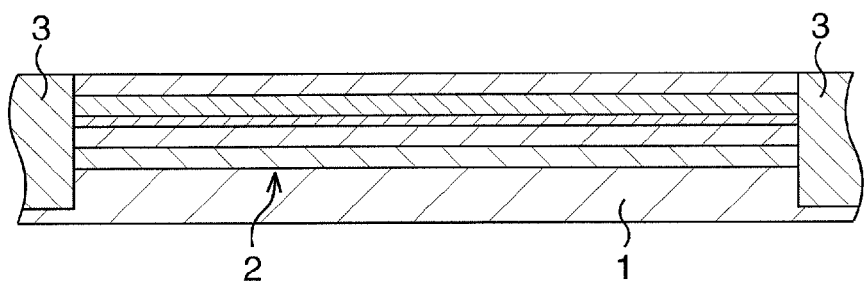
Figure 2A:
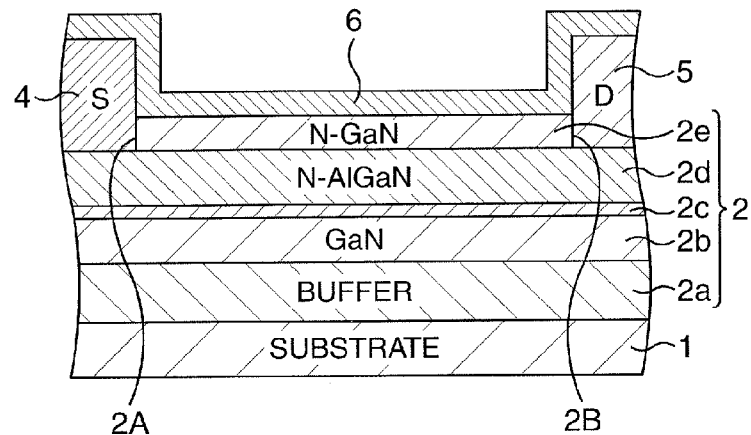
FIGS. 2A to 2C are schematic sectional views illustrating, in the order of steps, the method for manufacturing the AlGaN/GaN HEMT according to the first embodiment, following FIGS. 1A to 1C.

As illustrated in FIG. 1B, a device isolation structure 3 is formed. In FIG. 2A and subsequent figures, the device isolation structure 3 is not illustrated.

More specifically, for example, argon (Ar) is injected into a device isolation region of the compound semiconductor laminated structure 2. With this process, the device isolation structure 3 is formed at superficial portions of the compound semiconductor laminated structure 2 and SiC substrate 1. The device isolation structure 3 defines an active region on the compound semiconductor laminated structure 2.

Note that the device isolation may be performed by, e.g., shallow trench isolation (STI) instead of the injection. In this case, a chlorinated etching gas is used for dry etching of the compound semiconductor laminated structure 2.

Figure 1C:
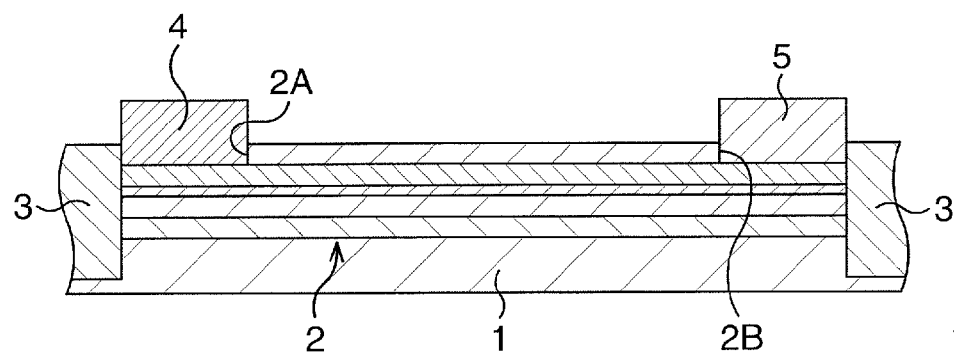

As illustrated in FIG. 1C, a source electrode 4 and a drain electrode 5 are formed.

More specifically, electrode recesses 2A and 2B are first formed at positions where a source electrode and a drain electrode are to be formed (intended electrode forming positions) on a surface of the compound semiconductor laminated structure 2.

A resist is applied to the surface of the compound semiconductor laminated structure 2. The resist is processed by lithography to form openings in the resist such that portions of the surface of the compound semiconductor laminated structure 2 corresponding to the intended electrode forming positions are exposed. With the above-described processes, a resist mask having the openings is formed.

Portions at the intended electrode forming positions of the cap layer 2e are removed by dry etching using the resist mask until a surface of the electron supply layer 2d is exposed. With this process, the electrode recesses 2A and 2B are formed such that the surface of the electron supply layer 2d is exposed at the intended electrode forming positions. The condition for the etching is that an inert gas such as Ar and a chlorinated gas such as $Cl_2$ are used as etching gases with, e.g., $Cl_2$ flow rate of 30 sccm, pressure of 2 Pa, and input RF power of 20 W. Note that the electrode recesses 2A and 2B may be formed by etching the cap layer 2e partway or by etching the compound semiconductor laminated structure 2 beyond the electron supply layer 2d.

The resist mask is removed by, e.g., ashing.

A resist mask for forming the source electrode and drain electrode is formed. For example, a double-layer resist with an overhang structure suitable for evaporation or lift-off is used here. The resist is applied to the compound semiconductor laminated structure 2, and openings for exposing the electrode recesses 2A and 2B are formed. With the above-described process, the resist mask having the openings is formed.

For example, Ti and Al as an electrode material are deposited on the resist mask and in the openings that expose the electrode recesses 2A and 2B by, e.g., evaporation. The thickness of Ti is set to about 30 nm, and the thickness of Al is set to about 300 nm. The resist mask and Ti and Al deposited on the resist mask are removed by lift-off. After that, the SiC substrate 1 is heat-treated at a temperature of about 400 to 1000° C. (e.g., about 600° C.) in, for example, a nitrogen atmosphere. Remaining Ti and Al are made to form an ohmic contact with the electron supply layer 2d without it. The heat treatment may be unnecessary if Ti and Al can form an ohmic contact with the electron supply layer 2d without it. With the above-described processes, the source electrode 4 and drain electrode 5, which plug the electrode recesses 2A and 2B with a part of the electrode material, are formed.

As illustrated in FIG. 2A, a passivation film 6 for protecting the surface of the compound semiconductor laminated structure 2 is formed.

More specifically, an insulating film, a single-layer silicon nitride film (SiN film) here, is deposited to a thickness of, e.g., about 40 nm by plasma CVD so as to cover the surface of the compound semiconductor laminated structure 2. With this process, the passivation film 6 is formed. As the passivation film 6, a single-layer silicon oxide film (SiO film), a single-layer silicon oxynitride film (SiON film), or a single-layer aluminum oxide film (AlO film) may be formed instead of a single-layer SiN film. A laminated film formed from any two or more selected from a group consisting of an SiN film, an SiO film, an SiON film, and an AlO film may be formed.

Figure 2B:
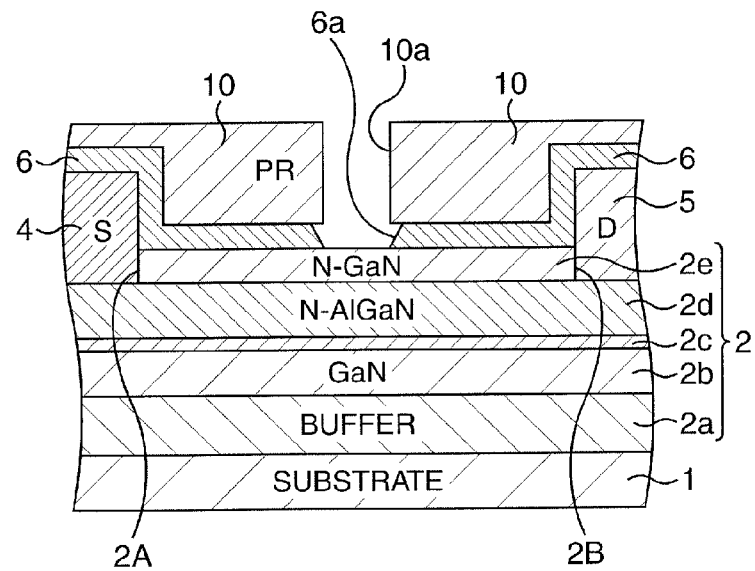

As illustrated in FIG. 2B, a through-hole 6a is formed by dry etching of the passivation film 6.

More specifically, a resist is first applied to the surface of the compound semiconductor laminated structure 2. The resist is processed by lithography to form an opening 10a in the resist such that a portion of a surface of the passivation film 6 corresponding to a position where a gate electrode is to be formed (an intended electrode forming position) is exposed. With the above-described processes, a resist mask 10 having the opening 10a is formed.

A portion exposed in the opening 10a at the intended electrode forming position of the passivation film 6 is removed by dry etching using the resist mask 10 until the surface of the compound semiconductor laminated structure 2 is exposed. The through-hole 6a is formed in the passivation film 6. An etching gas containing a fluorine-based gas such as $SF_6$ is used for the dry etching. A sidewall surface of the through-hole 6a is vertical or slightly forward tapered as illustrated in FIG. 2B.

Figure 2C:
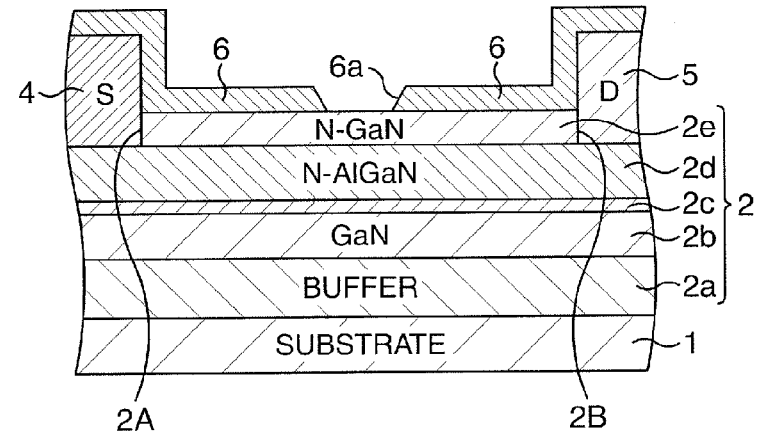

As illustrated in FIG. 2C, the resist mask 10 is removed.

More specifically, the resist mask 10 is removed by, e.g., asking or wet treatment using a predetermined drug solution.

Figure 3A:
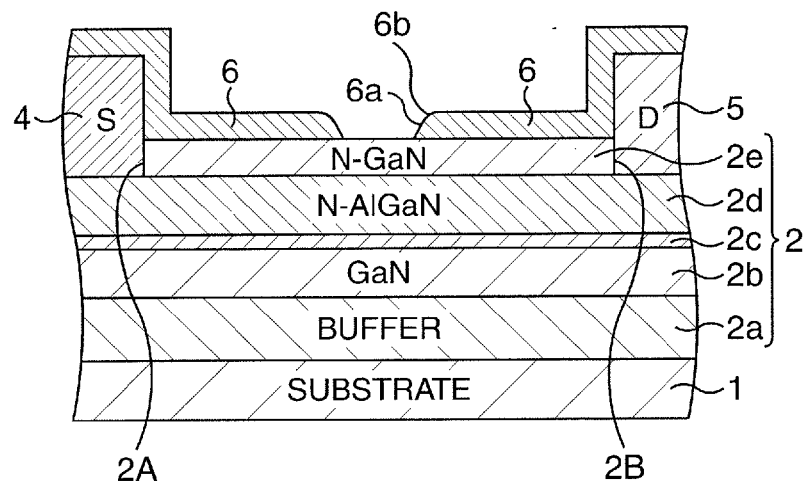
FIGS. 3A to 3C are schematic sectional views illustrating, in the order of steps, the method for manufacturing the AlGaN/GaN HEMT according to the first embodiment, following FIGS. 2A to 2C.

As illustrated in FIG. 3A, the passivation film 6 is wet-etched.

More specifically, an edge portion which is a sharp upper edge of the through-hole 6a is rounded by wet-etching of the passivation film 6 such that the upper edge has a curved surface. The upper edge having the curved surface will be referred to as an edge portion 6b. The wet etching is performed by using an etchant such as buffered HF for about 15 sec. In the present embodiment, the edge portion 6b having the curved surface as described above is formed by removing the resist mask 10 used for the dry etching and performing the wet etching with the passivation film 6 exposed.

The radius of curvature of the edge portion 6b having the curved surface is set to be not less than a quarter of the thickness of the passivation film 6 and not more than the thickness. If the radius of curvature is less than a quarter of the thickness of the passivation film 6, the edge portion is not sufficiently rounded, and the efficacy (to be described later) in inhibiting an electrode material from reaching the surface of the compound semiconductor laminated structure 2 is not sufficient. If the radius of curvature is more than the thickness of the passivation film 6, the opening size at an upper portion of the through-hole 6a is too large, and a desired fine gate electrode cannot be formed. Since the radius of curvature of the edge portion 6b is set to be not less than a quarter of the thickness of the passivation film 6 and not more than the thickness, the efficacy in inhibiting the electrode material from reaching the surface of the compound semiconductor laminated structure 2 can be achieved without affecting the opening size at the upper portion of the through-hole 6a. The passivation film 6 is formed so as to have a thickness of about 40 nm in the present embodiment, and the radius of curvature of the edge portion 6b is set to, e.g., about 10 nm, a quarter of the thickness of the passivation film 6.

Figure 3B:
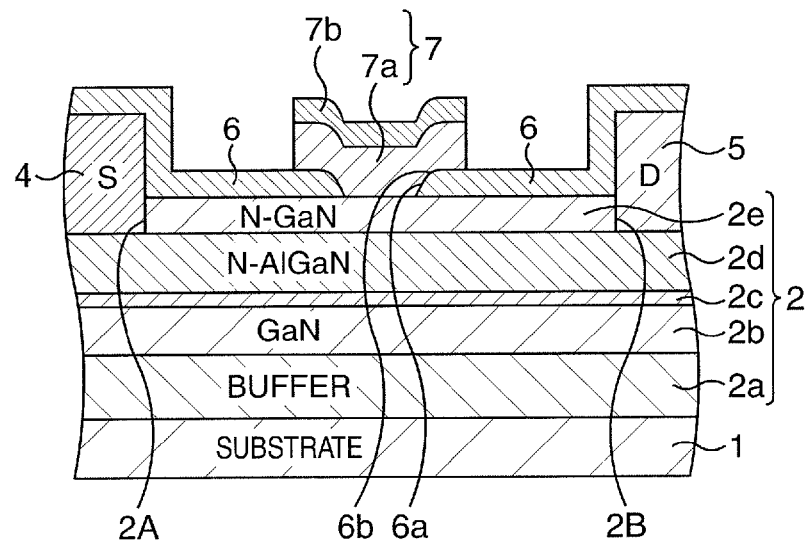

As illustrated in FIG. 3B, a gate electrode 7 is formed.

More specifically, a resist mask for forming the gate electrode is first formed. For example, a double-layer resist with an overhang structure suitable for evaporation or lift-off is used here. The resist is applied to the passivation film 6, and openings for exposing the through-hole 6a of the passivation film 6 are formed. With the above-described process, the resist mask having the openings is formed.

For example, Ni and Au as an electrode material are deposited on the resist mask and in the openings that expose the through-hole 6a of the passivation film 6 by, e.g., evaporation. The thickness of Ni is set to about 80 nm, and the thickness of Au is set to about 300 nm. The resist mask and Ni and Au deposited on the resist mask are removed by lift-off. With the above-described processes, the gate electrode 7 is formed on the passivation film 6 so as to plug the through-hole 6a with a part of Ni. A lower layer portion of the gate electrode 7 is an Ni layer 7a while an upper layer portion is an Au layer 7b.

Figure 3C:
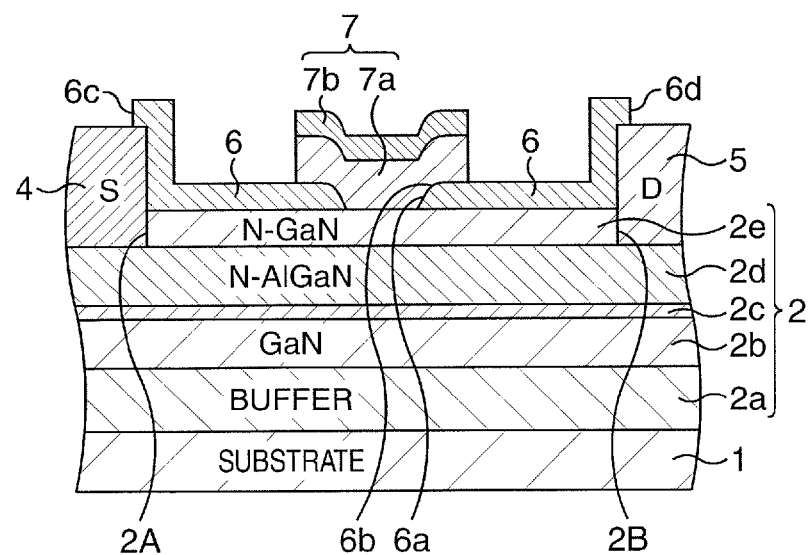

As illustrated in FIG. 3C, a portion on the source electrode 4 of the passivation film 6 and a portion on the drain electrode 5 are removed.

Figure 4:
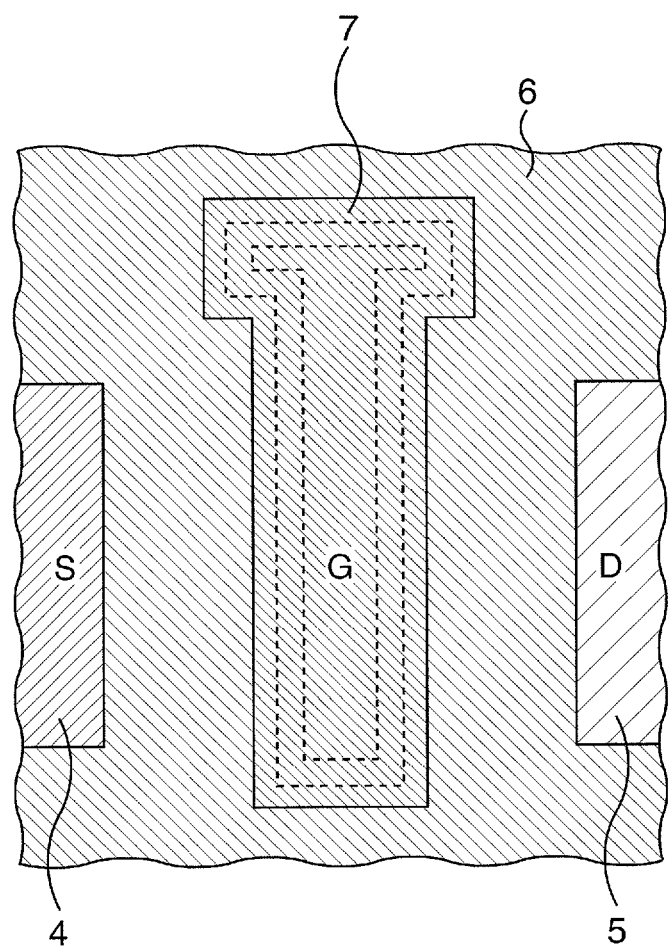
FIG. 4 is a schematic plan view of the step in FIG. 3C.

More specifically, the passivation film 6 is processed by lithography and dry etching. The dry etching is performed by using, e.g., $SF_6/CHF_3$ gas as an etching gas with upper electrode power of 500 W and lower electrode power of 50 W. With this process, an opening 6c for exposing a part of a surface of the source electrode 4 and an opening 6d for exposing a part of a surface of the drain electrode 5 are formed. FIG. 4 illustrates this state as seen from above.

With the above-described processes, a Schottky AlGaN/GaN HEMT according to the present embodiment is formed.

Figure 5:
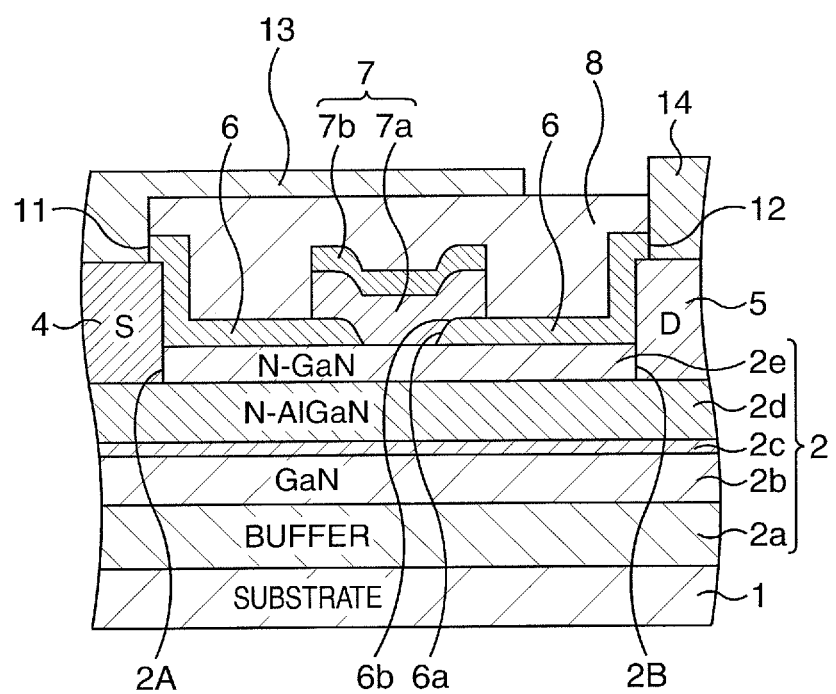
FIG. 5 is a schematic sectional view illustrating another method for manufacturing the AlGaN/GaN HEMT according to the first embodiment.

Note that, as illustrated in FIG. 5, after the gate electrode 7 is formed in FIG. 3B, an interlayer dielectric film 8 may be formed on the passivation film 6, and a portion on the source electrode 4 of the interlayer dielectric film 8 and a portion on the drain electrode 5 of the interlayer dielectric film 8 may be removed. In other words, the interlayer dielectric film 8 and passivation film 6 are processed by lithography and dry etching, and an opening 11 for exposing a part of the surface of the source electrode 4 and an opening 12 for exposing a part of the surface of the drain electrode 5 are formed. A wiring material is deposited on the interlayer dielectric film 8 so as to plug the openings 11 and 12 and is processed by lithography and dry etching. With the above-described processes, source wiring 13 which is electrically connected to the source electrode 4 and drain wiring 14 which is electrically connected to the drain electrode 5 are formed.

Effects of the Schottky AlGaN/GaN HEMT according to the present embodiment will be described below on the basis of comparison with a Schottky AlGaN/GaN HEMT according to a comparative example.

Figure 6A:
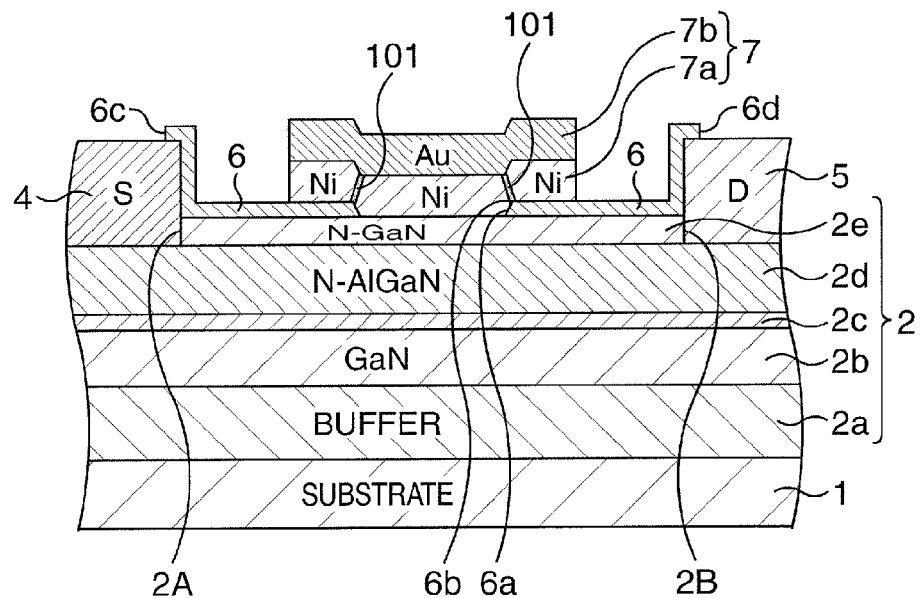
FIGS. 6A and 6B are schematic sectional views illustrating how a grain boundary is formed in a gate electrode in a Schottky AlGaN/GaN HEMT according to a comparative example relating to the first embodiment.
Figure 6B:
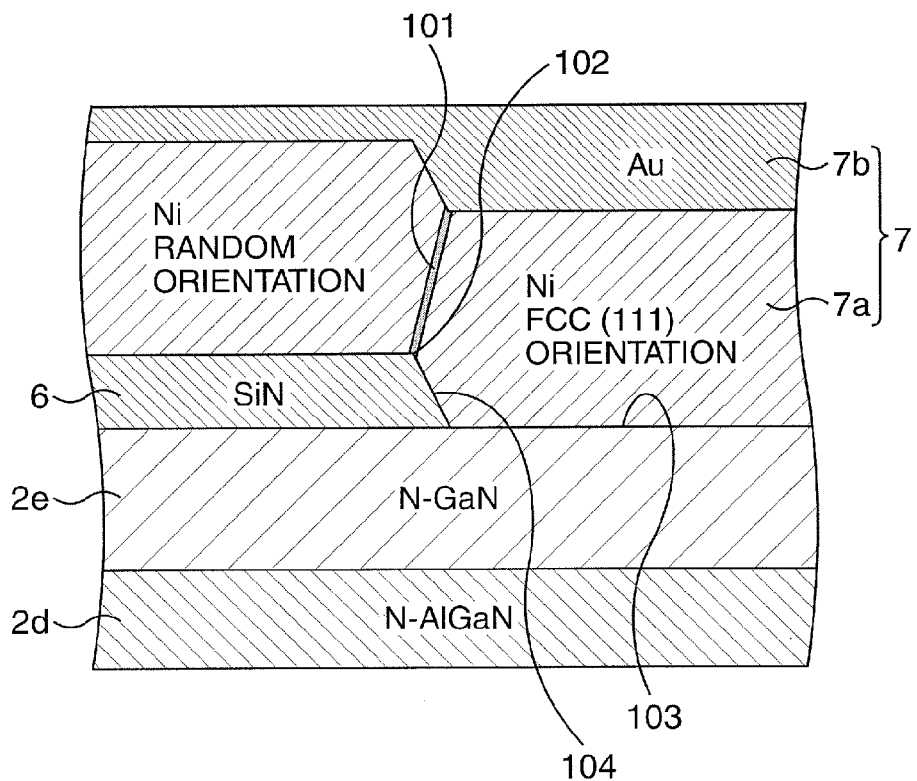
Figure 7A:
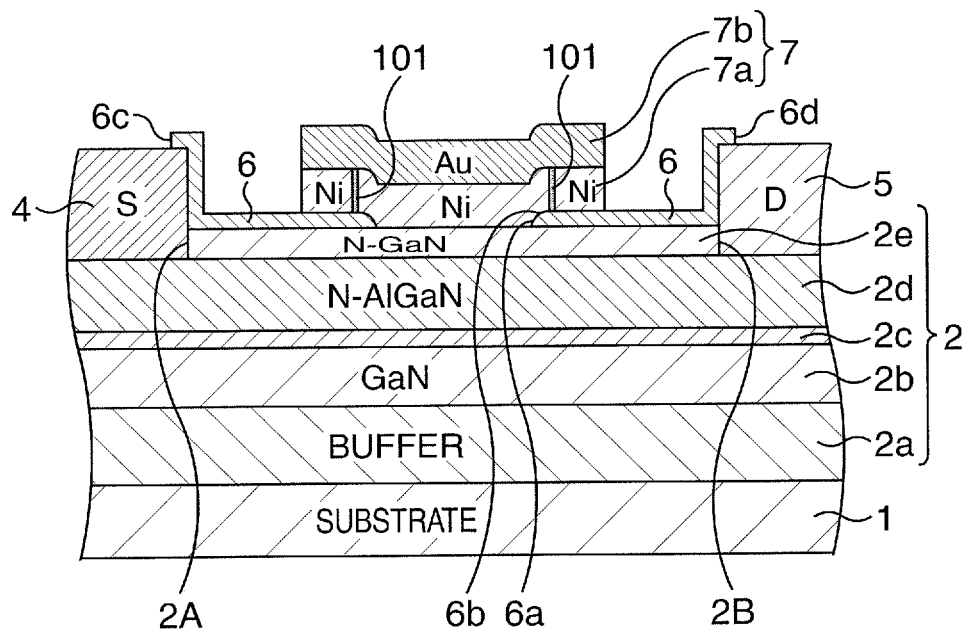
FIGS. 7A and 7B are schematic sectional views illustrating how a grain boundary is formed in a gate electrode in the Schottky AlGaN/GaN HEMT according to the first embodiment.
Figure 7B:
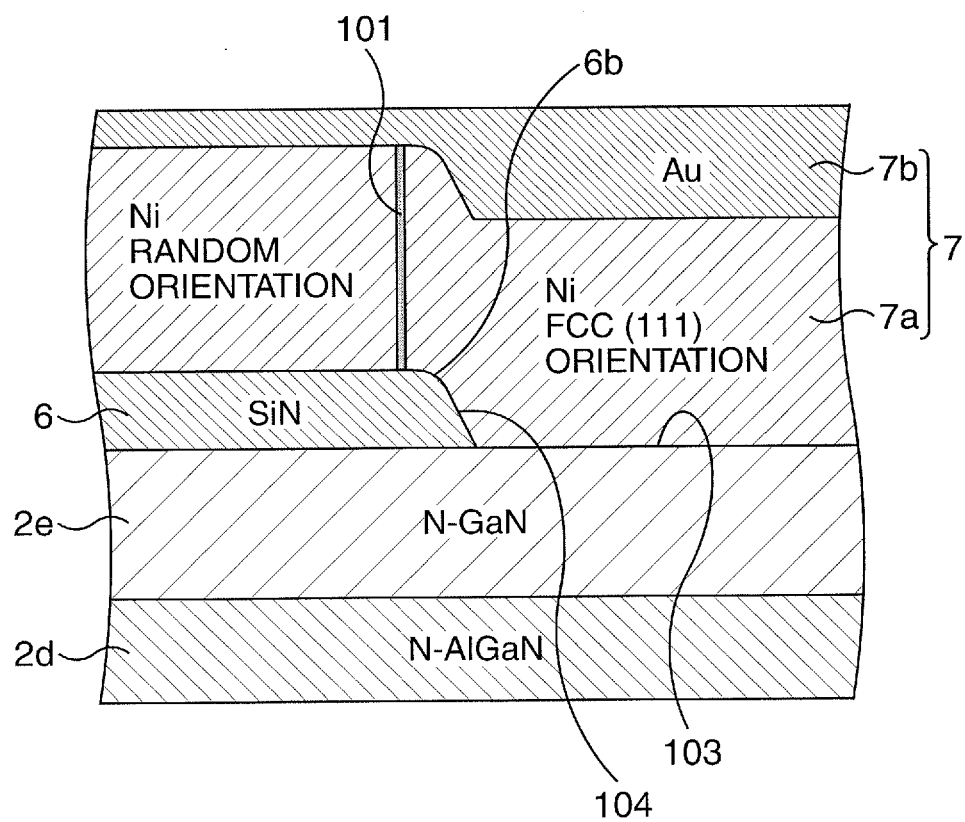

FIGS. 6A and 6B are schematic sectional views illustrating how a grain boundary is formed in a gate electrode in the Schottky AlGaN/GaN HEMT according to a comparative example relating to the first embodiment. FIG. 6A is an overall view, and FIG. 6B is a partial enlarged view. FIGS. 7A and 7B are schematic sectional views illustrating how a grain boundary is formed in the gate electrode in the Schottky AlGaN/GaN HEMT according to the first embodiment. FIG. 7A is an overall view, and FIG. 7B is a partial enlarged view. FIGS. 6B and 7B each illustrate, on an enlarged scale, an edge portion on the source electrode side in a through-hole for a gate electrode of a passivation film.

The comparative example in FIGS. 6A and 6B is a Schottky AlGaN/GaN HEMT made by a conventional method which does not include the wet etching step in FIG. 3A among the steps according to the present embodiment.

As in FIGS. 6A and 6B, in an Ni layer 7a of a gate electrode 7, Ni on the compound semiconductor laminated structure 2 forms a Schottky barrier with monocrystals of GaN of a cap layer 2e and has a face-centered cubic structure (fcc) (111) orientation. In contrast, in the Ni layer 7a of the gate electrode 7, Ni on the passivation film 6 is affected by the amorphous structure of the passivation film 6 and has a random orientation. For this reason, a very large grain boundary 101 is formed between the Ni having a fcc (111) orientation and the Ni having a random orientation. An edge portion 102 which is an upper edge of a through-hole 6a of the passivation film 6 is sharp. The grain boundary 101 is thus formed so as to extend from the edge portion 102 as a starting point. Since a surface of the passivation film 6 comes into intimate contact with a resist mask 10 for forming the through-hole 6a, if only normal dry etching or wet etching is used, the edge portion 102 is sharp (has a radius of curvature of not more than 5 nm). As illustrated in FIGS. 6A and 6B, the grain boundary 101 is formed near a nitride semiconductor surface (Schottky surface) 103 so as to extend from the edge portion 102 as the starting point. In this case, when an interface (sidewall interface) 104 between Ni and a sidewall of the through-hole 6a of the passivation film 6 splits open due to thermal stress or the like, Au of the Au layer 7b of the gate electrode 7 passes through the grain boundary 101 and sidewall interface 104 and reaches the Schottky surface 103 to react with the Schottky surface 103. This deteriorates gate characteristics and lowers the reliability of the GaN-HEMT.

In contrast with this, in the present embodiment, wet etching is performed from above the passivation film 6 with the resist mask 10 removed, and the edge portion 6b having the curved surface is formed, as in FIGS. 2C and 3A. For this reason, as illustrated in FIGS. 7A and 7B, it has been found that an end (starting point) of a grain boundary 101 of Ni is formed at a position apart from the edge portion 6b toward the source electrode 4 or the drain electrode 5 on a flat surface of the surface of the passivation film 6 (a flat surface parallel to the surface of the compound semiconductor laminated structure 2). As described above, the grain boundary 101 of Ni is spaced apart from a Schottky surface 103, and the starting point of the grain boundary 101 is provided on the flat surface of the passivation film 6. Even if a sidewall interface 104 splits open, Au is inhibited from reaching the Schottky surface 103 from the Au layer 7b.

Figure 8:
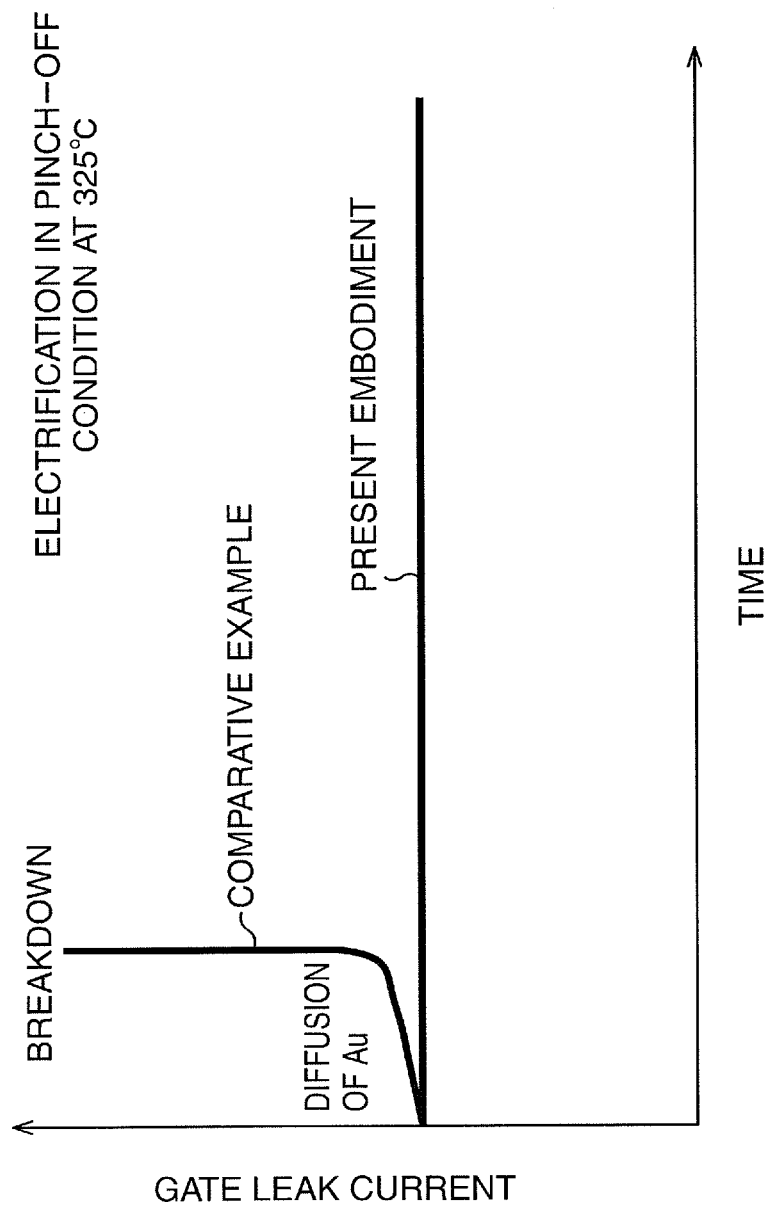
FIG. 8 is a graph illustrating a result of checking gate leak currents generated in the Schottky AlGaN/GaN HEMT according to the first embodiment and the comparative example.

FIG. 8 is a graph illustrating a result of checking gate leak currents generated in the Schottky AlGaN/GaN HEMT according to the first embodiment and the comparative example.

In the comparative example, a gate leak current in a pinch-off condition at a high temperature (325° C.) increases with diffusion of Au across the Schottky surface, which eventually results in a breakdown. In contrast, in the present embodiment, diffusion of Au is inhibited, a gate leak current is limited, and the reliability of the AlGaN/GaN HEMT is higher.

As has been described above, according to the present embodiment, a highly reliable, high-voltage AlGaN/GaN HEMT which inhibits Au as an electrode material from reaching an interface between the gate electrode 7 and the compound semiconductor laminated structure 2 and prevents deterioration in gate characteristics is achieved.

(Modification)

A modification of the first embodiment will be described. In the present modification, an AlGaN/GaN HEMT is fabricated, as in the first embodiment. The present modification, however, is different from the first embodiment in a step of forming a through-hole for forming a gate electrode in a passivation film.

FIGS. 9A to 10B are schematic sectional views illustrating main steps of a method for manufacturing an AlGaN/GaN HEMT according to the modification of the first embodiment.

The steps in FIGS. 2A to 2A are first sequentially performed, as in the first embodiment.

Figure 9A:
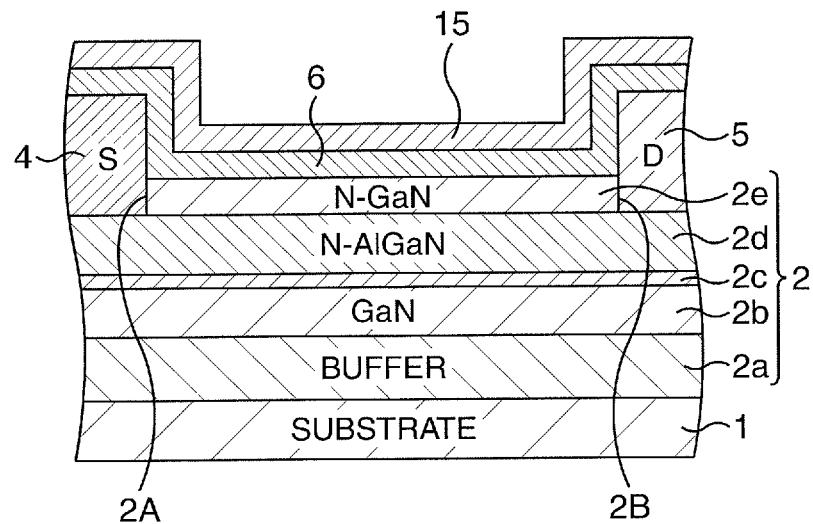
FIGS. 9A and 9B are schematic sectional views illustrating main steps of a method for manufacturing an AlGaN/GaN HEMT according to a modification of the first embodiment.

As illustrated in FIG. 9A, a passivation film 15 which is made of a material having a wet etching rate higher than that of the passivation film 6 is formed.

More specifically, a material for the passivation film 6 having a wet etching rate higher than that of SiN, such as $SiO_2$, is deposited on the passivation film 6 to a thickness of about 20 nm by, e.g., plasma CVD. With this process, the passivation film 15 covering the passivation film 6 is formed.

Figure 9B:
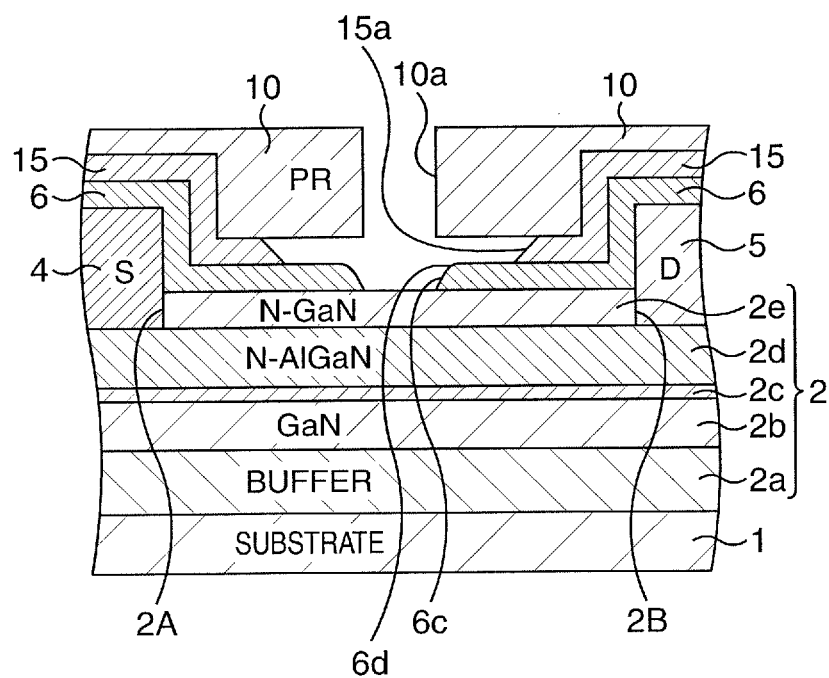

As illustrated in FIG. 9B, the passivation films 15 and 6 are wet-etched to form the through-hole 6c in the passivation film 6.

More specifically, a resist is first applied to a surface of the compound semiconductor laminated structure 2. The resist is processed by lithography to form the opening 10a in the resist such that a portion of a surface of the passivation film 15 corresponding to a position where a gate electrode is to be formed (an intended electrode forming position) is exposed. With the above-described processes, the resist mask 10 having the opening 10a is formed.

The passivation films 15 and 6 are wet-etched using the resist mask 10 until the surface of the compound semiconductor laminated structure 2 is exposed at the intended electrode forming position of the passivation film 15 exposed in the opening 10a. An etchant such as buffered HF is used for the wet etching. Since the wet etching rate of the passivation film 15 is higher than that of the passivation film 6, the passivation film 15 is etched to a larger extent than the passivation film 6 to form a through-hole 15a. Additionally, the through-hole 6c including the rounded edge portion 6d at an upper edge and having a curved surface is formed in the passivation film 6. The through-hole 6c has a smaller diameter than that of the through-hole 15a and is formed so as to be surrounded by the through-hole 15a. In the present modification, the passivation film 6 is wet-etched via the passivation film 15 on the passivation film 6 having a higher wet etching rate than that of the passivation film 6. For this reason, the through-hole 6c including the edge portion 6d having the curved surface as described above is formed without being blocked by the resist mask 10.

After that, the resist mask 10 is removed by, e.g., ashing or wet treatment using a predetermined drug solution.

The radius of curvature of the edge portion 6d having the curved surface is set to be not less than a quarter of the thickness of the passivation film 6 and not more than the thickness. If the radius of curvature is less than a quarter of the thickness of the passivation film 6, the edge portion is not sufficiently rounded, and the efficacy in inhibiting an electrode material from reaching the surface of the compound semiconductor laminated structure 2 is not sufficient. If the radius of curvature is more than the thickness of the passivation film 6, the opening size at an upper portion of the through-hole 6c is too large, and a desired fine gate electrode cannot be formed. Since the radius of curvature of the edge portion 6d is set to be not less than a quarter of the thickness of the passivation film 6 and not more than the thickness, the efficacy in inhibiting the electrode material from reaching the surface of the compound semiconductor laminated structure 2 can be achieved without affecting the opening size at the upper portion of the through-hole 6c. The passivation film 6 is formed so as to have a thickness of about 40 nm in the present modification, and the radius of curvature of the edge portion 6d is set to, e.g., about 10 nm, a quarter of the thickness of the passivation film 6.

Figure 10A:
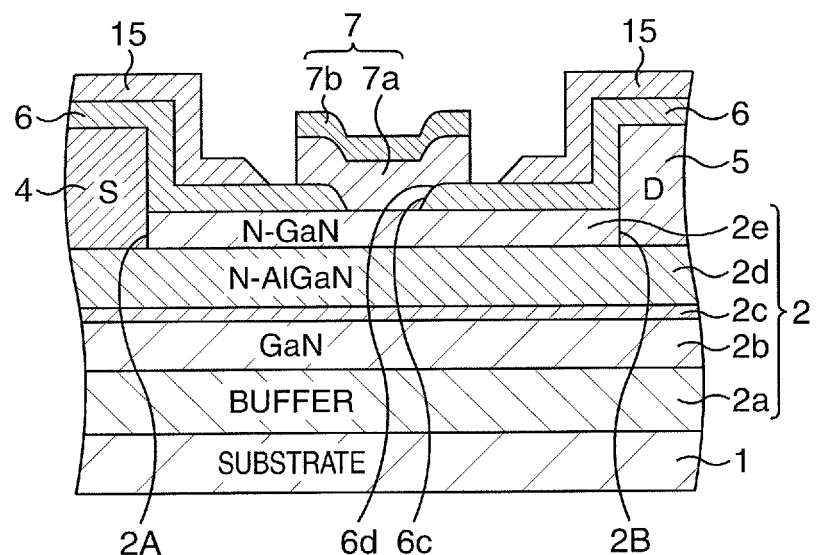
FIGS. 10A and 10B are schematic sectional views illustrating the main steps of the method for manufacturing the AlGaN/GaN HEMT according to the modification of the first embodiment, following FIGS. 9A and 9B.

As illustrated in FIG. 10A, the gate electrode 7 is formed.

More specifically, a resist mask for forming the gate electrode is first formed. For example, a double-layer resist with an overhang structure suitable for evaporation or lift-off is used here. The resist is applied to the passivation films 15 and 6, and openings for exposing the through-hole 6c of the passivation film 6 are formed. With the above-described process, the resist mask having the openings is formed.

For example, Ni and Au as an electrode material are deposited on the resist mask and in the openings that expose the through-hole 6d of the passivation film 6 by, e.g., evaporation. The thickness of Ni is set to about 80 nm, and the thickness of Au is set to about 300 nm. The resist mask and Ni and Au deposited on the resist mask are removed by lift-off. With the above-described processes, the gate electrode 7 is formed on the passivation film 6 so as to plug the through-hole 6d with a part of Ni. A lower layer portion of the gate electrode 7 is the Ni layer 7a while an upper layer portion is the Au layer 7b.

Figure 10B:
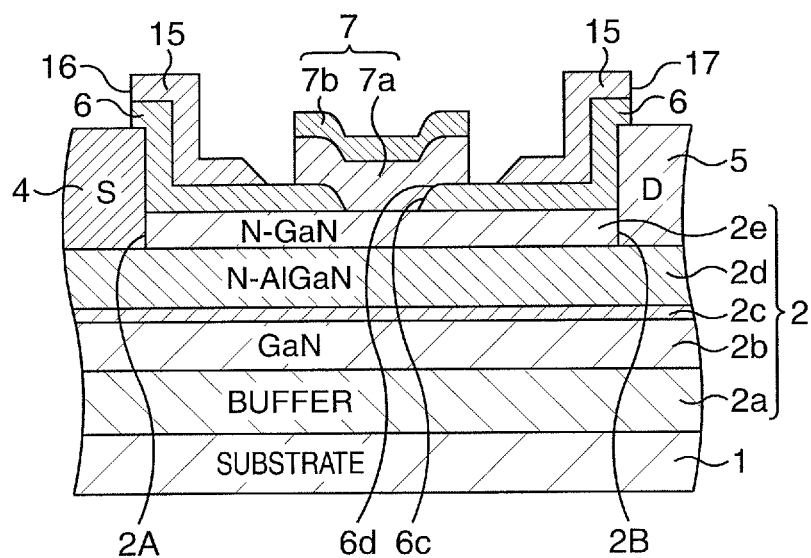

As illustrated in FIG. 10B, portions on the source electrode 4 of the passivation films 15 and 6 and portions on the drain electrode 5 are removed.

Figure 11:
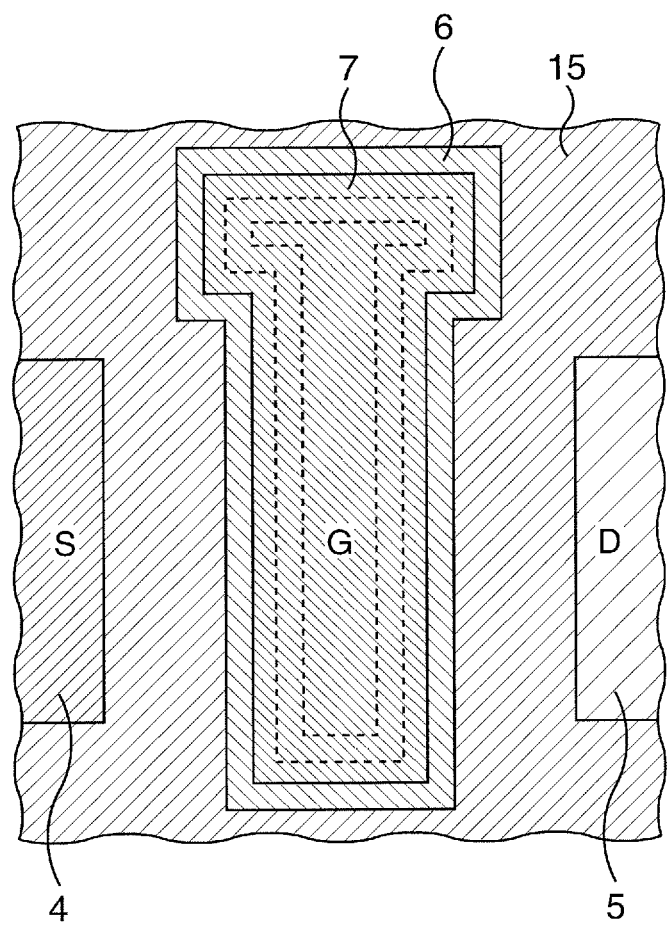
FIG. 11 is a schematic plan view of the step in FIG. 10B.

More specifically, the passivation films 15 and 6 are processed by lithography and dry etching. The dry etching is performed by using, e.g., $SF_6/CHF_3$ gas as an etching gas with upper electrode power of 500 W and lower electrode power of 50 W. With this process, an opening 16 for exposing a part of a surface of the source electrode 4 and an opening 17 for exposing a part of a surface of the drain electrode 5 are formed. FIG. 11 illustrates this state as seen from above.

With the above-described processes, a Schottky AlGaN/GaN HEMT according to the present modification is formed.

Figure 12:
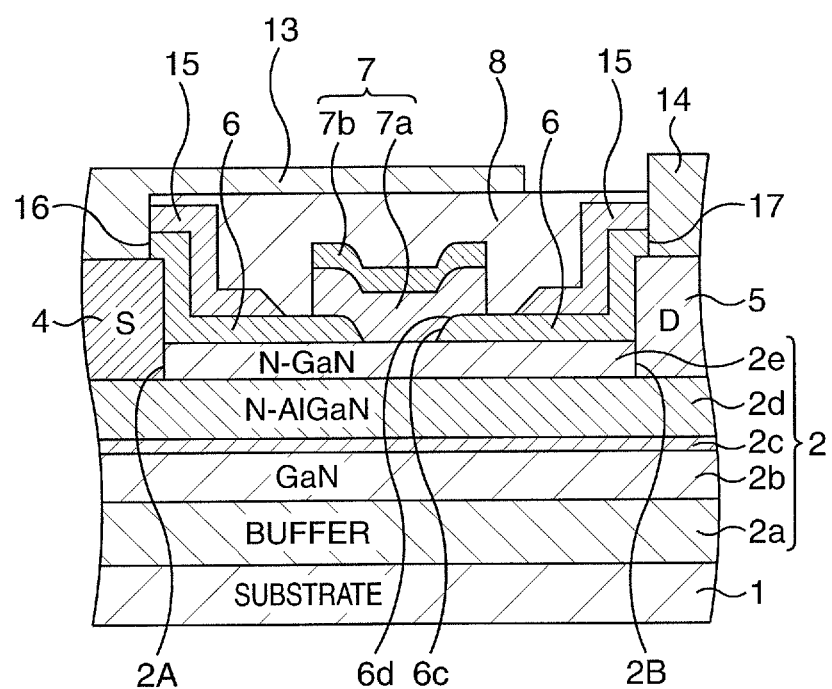
FIG. 12 is a schematic sectional view illustrating another method for manufacturing the AlGaN/GaN HEMT according to the modification of the first embodiment.

Note that, as illustrated in FIG. 12, after the gate electrode 7 is formed in FIG. 10A, the interlayer dielectric film 8 may be formed on the passivation film 15, and a portion on the source electrode 4 of the interlayer dielectric film 8 and a portion on the drain electrode 5 of the interlayer dielectric film 8 may be removed. In other words, the interlayer dielectric film 8 and passivation films 15 and 6 are processed by lithography and dry etching, and the opening 16 for exposing a part of the surface of the source electrode 4 and the opening 17 for exposing a part of the surface of the drain electrode 5 are formed. A wiring material is deposited on the interlayer dielectric film 8 so as to plug the openings 16 and 17 and is processed by lithography and dry etching. With the above-described processes, the source wiring 13 electrically connected to the source electrode 4 and the drain wiring 14 electrically connected to the drain electrode 5 are formed.

As has been described above, according to the present modification, a highly reliable, high-voltage AlGaN/GaN HEMT which inhibits Au as an electrode material from reaching an interface between the gate electrode 7 and the compound semiconductor laminated structure 2 and prevents deterioration in gate characteristics is achieved.

Second Embodiment

The present embodiment discloses a Schottky barrier diode of a GaN-based semiconductor (GaN-SBD) as a compound semiconductor.

FIGS. 13A to 15B are schematic sectional views illustrating, in the order of steps, a method for manufacturing a GaN-SBD according to the second embodiment.

Figure 13A:
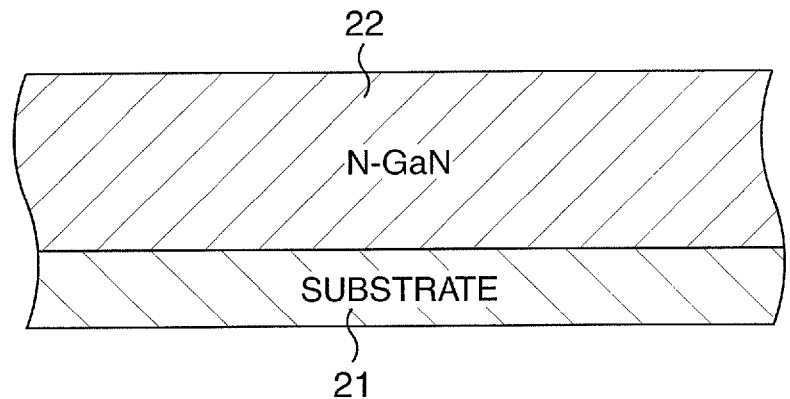
FIGS. 13A to 13C are schematic sectional views illustrating, in the order of steps, a method for manufacturing a GaN-SBD according to a second embodiment.

As illustrated in FIG. 13A, a compound semiconductor layer 22 is first formed on, for example, an n+-GaN substrate 21 as a growth substrate. As the growth substrate, an Si substrate, an SiC substrate, a sapphire substrate, a GaAs substrate, or the like may be used instead of a GaN substrate. The substrate may be semi-insulating or conductive.

The compound semiconductor layer 22 is formed by growing an n-GaN epitaxial layer by MOVPE. The n-GaN epitaxial layer is formed to a predetermined thickness and is made n-type by doping with an n-type impurity such as Si. The thickness and doping concentration are arbitrarily selected according to properties needed for a GaN-SBD. For example, the thickness is set to about 1 μm, and the doping concentration is set to about $1 \times 10^{17}/cm^3$.

Figure 13B:
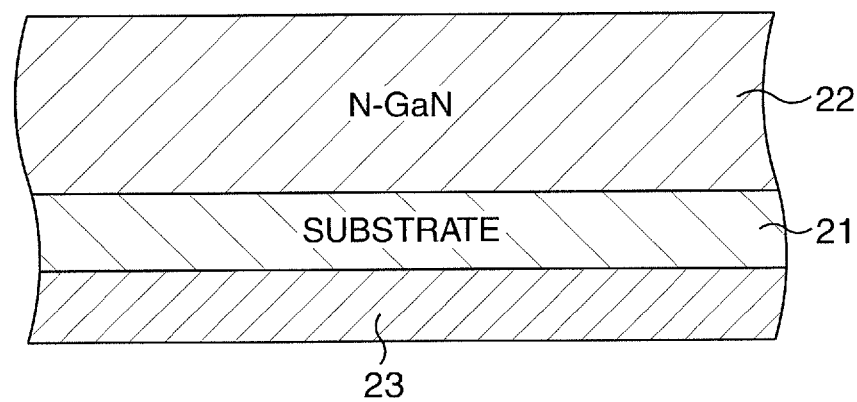

As illustrated in FIG. 13B, a cathode electrode 23 is formed on a back surface of the n+-GaN substrate 21.

More specifically, Ti with a thickness of about 20 nm and Al with a thickness of about 200 nm are formed in order on the back surface of the $n^+$-GaN substrate 21 by, e.g., evaporation. The $n^+$-GaN substrate 21 is heat-treated at a temperature of about 550° C., and the $n^+$-GaN substrate 21 and the laminated film are made to form an ohmic contact. With the above-described processes, the cathode electrode 23 is formed on the bask surface of the $n^+$-GaN substrate 21.

Figure 13C:
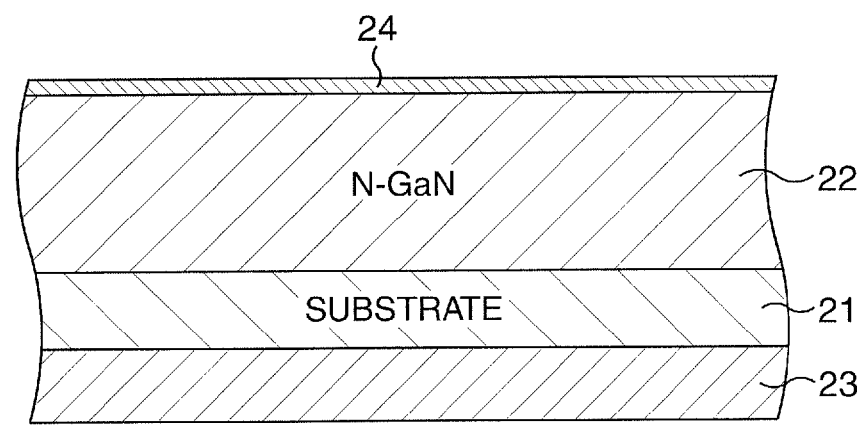

As illustrated in FIG. 13C, a passivation film 24 for protecting a surface of the compound semiconductor layer 22 is formed.

More specifically, an insulating film, a single-layer silicon nitride film (SiN film) here, is deposited to a thickness of, e.g., about 40 nm by plasma CVD so as to cover the surface of the compound semiconductor layer 22. With this process, the passivation film 24 is formed. As the passivation film 24, a single-layer silicon oxide film (SiO film), a single-layer silicon oxynitride film (SiON film), or a single-layer aluminum oxide film (AlO film) may be formed instead of a single-layer SiN film. A laminated film formed of any two or more selected from a group consisting of an SiN film, an SiO film, an SiON film, and an AlO film may be formed.

Figure 14A:
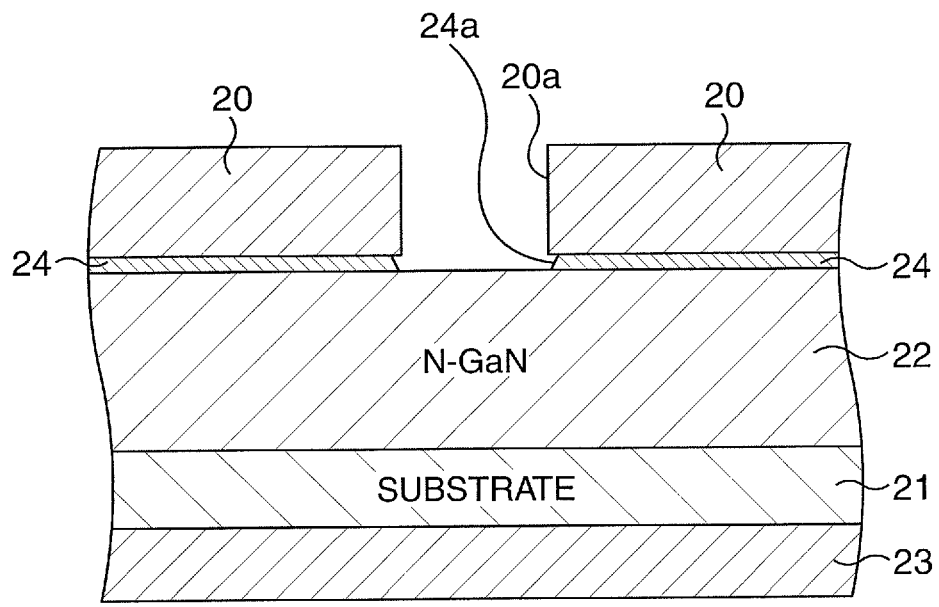
FIGS. 14A and 14B are schematic sectional views illustrating, in the order of steps, the method for manufacturing the GaN-SBD according to the second embodiment, following FIGS. 13A to 13C.

As illustrated in FIG. 14A, the passivation film 24 is dry-etched to form a through-hole 24a.

More specifically, a resist is first applied to the surface of the compound semiconductor layer 22. The resist is processed by lithography to form an opening 20a in the resist such that a portion of a surface of the passivation film 24 corresponding to a position where an anode electrode is to be formed (an intended electrode forming position) is exposed. With the above-described processes, a resist mask 20 having the opening 20a is formed.

A portion exposed in the opening 20a at the intended electrode forming position of the passivation film 24 is dry-etched by using the resist mask 20 until the surface of the compound semiconductor layer 22 is exposed. The through-hole 24a is formed in the passivation film 24. An etching gas containing a fluorine-based gas such as $SF_6$ is used for the dry etching. A sidewall surface of the through-hole 24a is vertical or slightly forward tapered as illustrated in FIG. 14A.

Figure 14B:
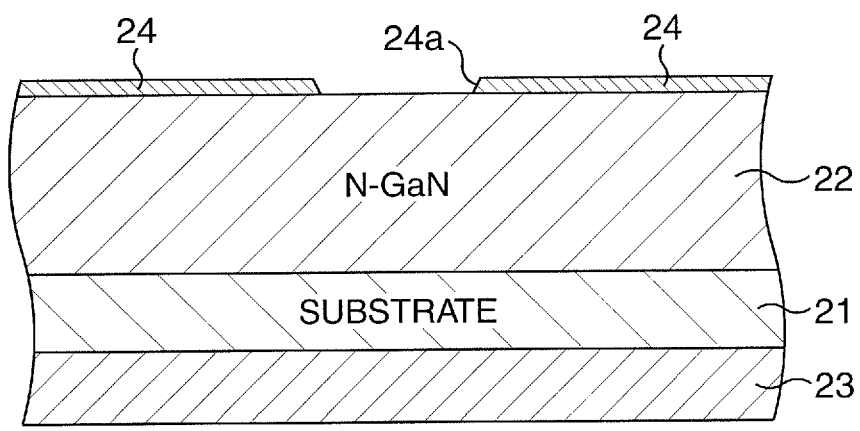

As illustrated in FIG. 14B, the resist mask 20 is removed.

More specifically, the resist mask 20 is removed by, e.g., ashing or wet treatment using a predetermined drug solution.

Figure 15A:
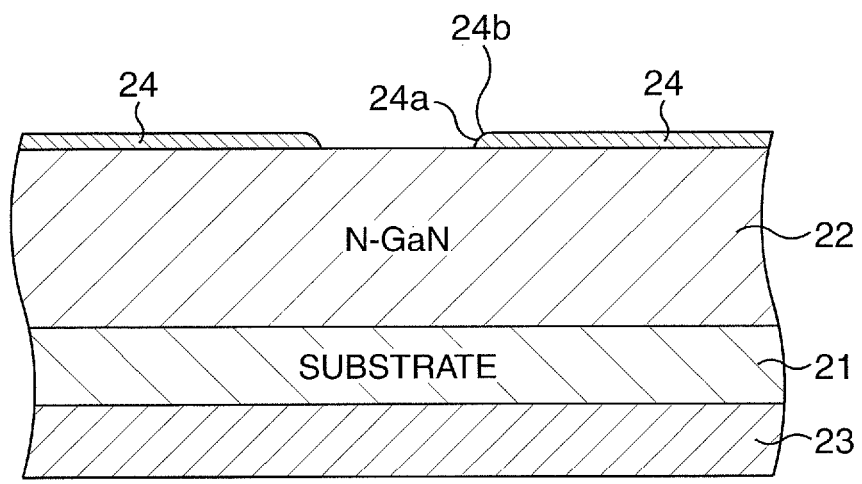
FIGS. 15A and 15B are schematic sectional views illustrating, in the order of steps, the method for manufacturing the GaN-SBD according to the second embodiment, following FIGS. 14A and 14B.

As illustrated in FIG. 15A, the passivation film 24 is wet-etched.

More specifically, an edge portion which is a sharp upper edge of the through-hole 24a is rounded by wet-etching of the passivation film 24 such that the upper edge has a curved surface. The upper edge having the curved surface will be referred to as an edge portion 24b. The wet etching is performed by using an etchant such as buffered HF for about 15 sec. In the present embodiment, the edge portion 24b having the curved surface as described above is formed by removing the resist mask 20 used for the dry etching and performing the wet etching with the passivation film 24 exposed.

The radius of curvature of the edge portion 24b having the curved surface is set to be not less than a quarter of the thickness of the passivation film 24 and not more than the thickness. If the radius of curvature is less than a quarter of the thickness of the passivation film 24, the edge portion is not sufficiently rounded, and the efficacy (to be described later) in inhibiting an electrode material from reaching the surface of the compound semiconductor laminated structure 22 is not sufficient. If the radius of curvature is more than the thickness of the passivation film 24, the opening size at an upper portion of the through-hole 24a is too large, and a desired fine anode electrode cannot be formed. Since the radius of curvature of the edge portion 24b is set to be not less than a quarter of the thickness of the passivation film 24 and not more than the thickness, the efficacy in inhibiting the electrode material from reaching the surface of the compound semiconductor laminated structure 22 can be achieved without affecting the opening size at the upper portion of the through-hole 24a. The passivation film 24 is formed so as to have a thickness of about 40 nm in the present embodiment, and the radius of curvature of the edge portion 24b is set to, e.g., about 10 nm, a quarter of the thickness of the passivation film 24.

Figure 15B:
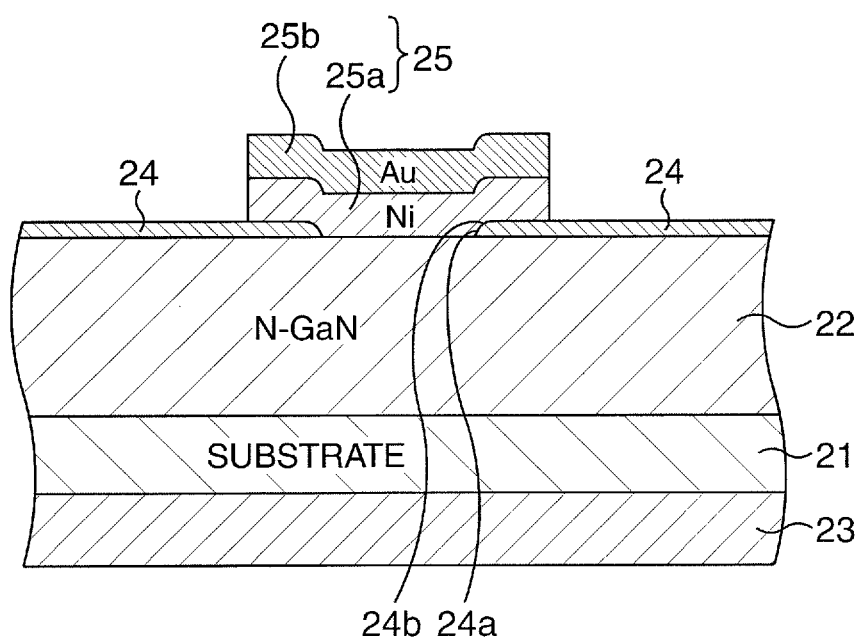

As illustrated in FIG. 15B, an anode electrode 25 is formed.

More specifically, a resist mask for forming the anode electrode is first formed. For example, a double-layer resist with an overhang structure suitable for evaporation or lift-off is used here. The resist is applied to the passivation film 24, and openings for exposing the through-hole 24a of the passivation film 24 are formed. With the above-described process, the resist mask having the openings is formed.

For example, Ni and Au as an electrode material are deposited on the resist mask and in the openings that expose the through-hole 24a of the passivation film 24 by, e.g., evaporation. The thickness of Ni is set to about 80 nm, and the thickness of Au is set to about 300 nm. The resist mask and Ni and Au deposited on the resist mask are removed by lift-off. With the above-described processes, the anode electrode 25 is formed on the passivation film 24 so as to plug the through-hole 24a with a part of Ni. A lower layer portion of the anode electrode 25 is a Ni layer 25a while an upper layer portion is an Au layer 25b.

After steps such as electrical connection of the cathode electrode 23 and anode electrode 25, a GaN-SBD according to the present embodiment is formed.

Figure 16A:
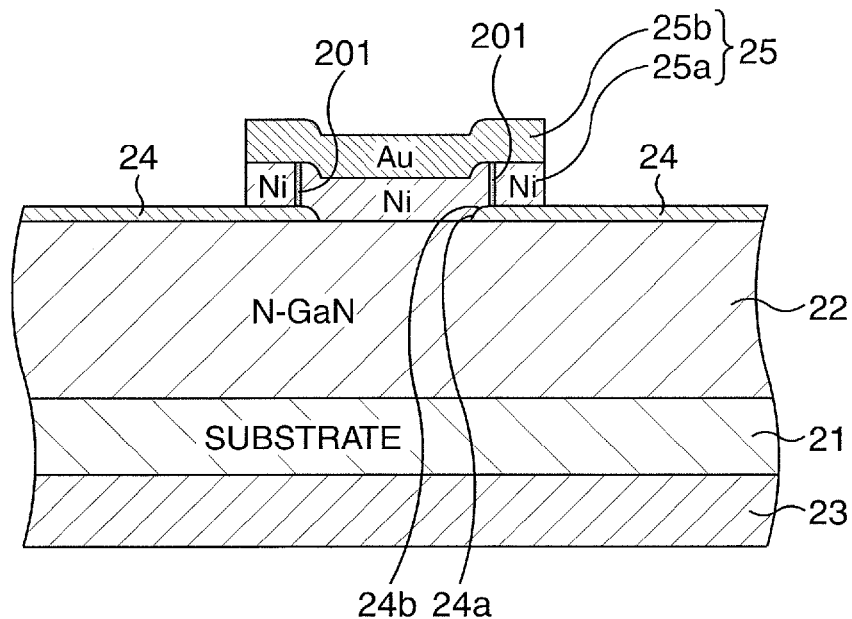
FIGS. 16A and 16B are schematic sectional views illustrating how a grain boundary is formed in an anode electrode in the GaN-SBD according to the second embodiment.
Figure 16B:
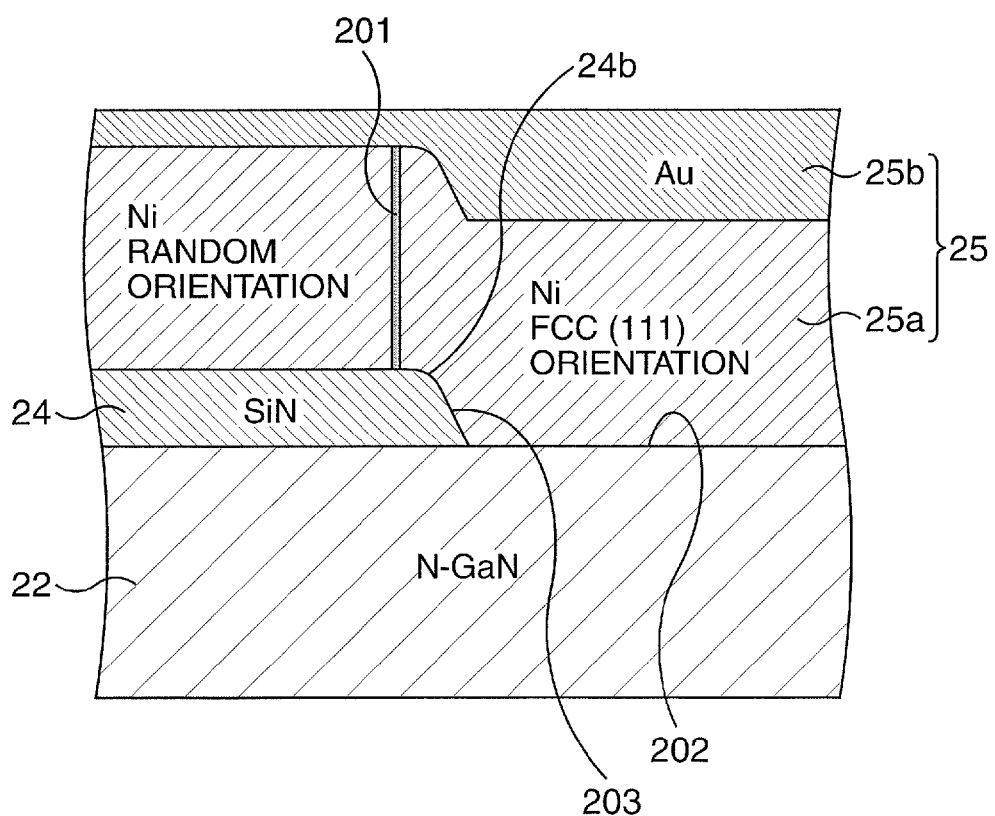

Effects of the GaN-SBD according to the present embodiment will be described below. FIGS. 16A and 16B are schematic sectional views illustrating how a grain boundary is formed in the anode electrode in the GaN-SBD according to the second embodiment. FIG. 16A is an overall view, and FIG. 16B is a partial enlarged view. FIG. 16B illustrates, on an enlarged scale, an edge portion on the source electrode side in a through-hole for an anode electrode of a passivation film.

In the present embodiment, wet etching is performed from above the passivation film 24 with the resist mask 20 removed, and the edge portion 24b having the curved surface is formed, as in FIGS. 14B and 15A. For this reason, as illustrated in FIGS. 16A and 16B, it has been found that a starting point of a grain boundary 201 of Ni is formed at a position apart from the edge portion 24b toward the outside on a flat surface of the surface of the passivation film 24 (a flat surface parallel to the surface of the compound semiconductor laminated structure 22). As described above, the grain boundary 201 of Ni is spaced apart from a Schottky surface 202, and the starting point of the grain boundary 201 is provided on the flat surface of the passivation film 24. Even if a sidewall interface 203 splits open, Au is inhibited from reaching the Schottky surface 202 from the Au layer 25b.

As has been described above, according to the present embodiment, a highly reliable, high-voltage GaN-SBD which inhibits Au as an electrode material from reaching an interface between the anode electrode 25 and the compound semiconductor laminated structure 22 and prevents deterioration in anode characteristics is achieved.

(Modification)

A modification of the second embodiment will be described. In the present modification, a GaN-SBD is fabricated, as in the second embodiment. The present modification, however, is different from the second embodiment in a step of forming a through-hole for forming an anode electrode in a passivation film.

Figure 17A:
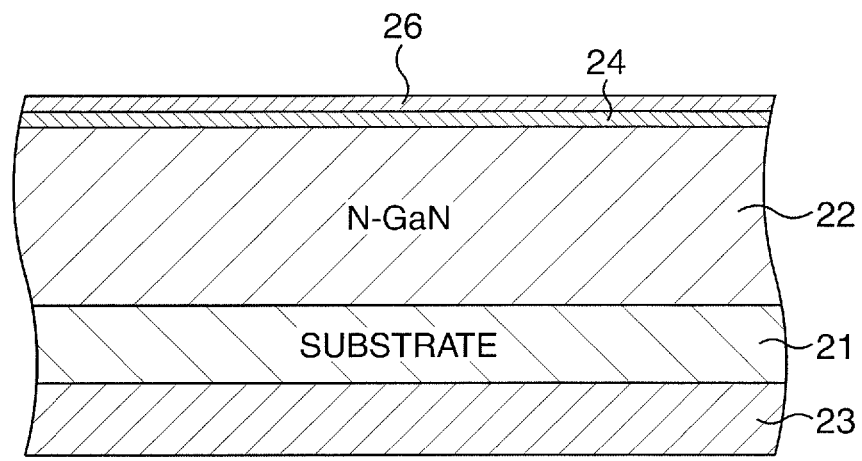
FIGS. 17A and 17B are schematic sectional views illustrating main steps of a method for manufacturing a GaN-SBD according to a modification of the second embodiment.
Figure 17B:
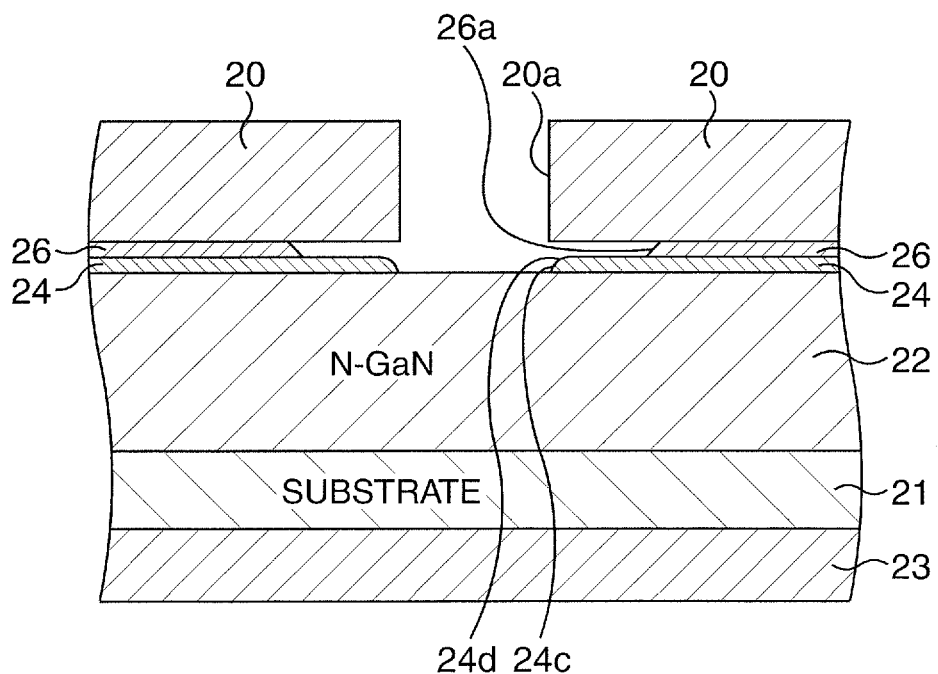
Figure 18:
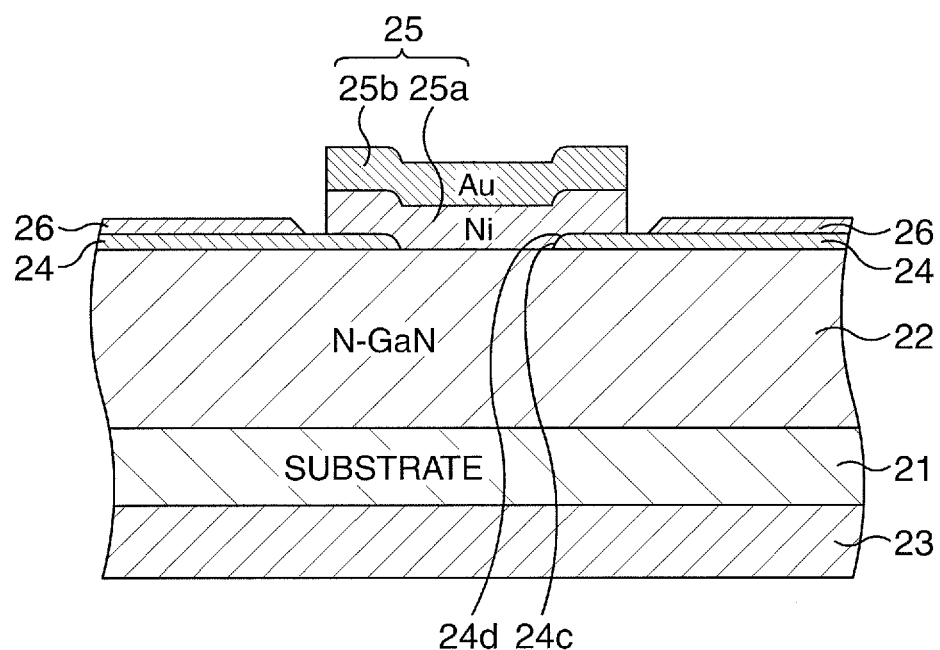
FIG. 18 is a schematic sectional view illustrating the main steps of the method for manufacturing the GaN-SBD according to the modification of the second embodiment, following FIGS. 17A and 17B.

FIGS. 17A to 18 are schematic sectional views illustrating main steps of a method for manufacturing a GaN-SBD according to the modification of the second embodiment.

The steps in FIGS. 13A to 13C are first sequentially performed, as in the second embodiment.

As illustrated in FIG. 17A, a passivation film 26 which is made of a material having a wet etching rate higher than that of the passivation film 24 is formed.

More specifically, a material for the passivation film 26 having a wet etching rate higher than that of SiN, such as $SiO_2$, is deposited on the passivation film 24 to a thickness of about 20 nm by, e.g., plasma CVD. With this process, the passivation film 26 covering the passivation film 24 is formed.

As illustrated in FIG. 17B, the passivation films 26 and 24 are wet-etched to form a through-hole 24c in the passivation film 24.

More specifically, a resist is first applied to a surface of the compound semiconductor laminated structure 22. The resist is processed by lithography to form the opening 20a in the resist such that a portion of a surface of the passivation film 26 corresponding to a position where an anode electrode is to be formed (an intended electrode forming position) is exposed. With the above-described processes, the resist mask 20 having the opening 20a is formed.

The passivation films 26 and 24 are wet-etched using the resist mask 20 until the surface of the compound semiconductor laminated structure 22 is exposed at the intended electrode forming position of the passivation film 26 exposed in the opening 20a. An etchant such as buffered HF is used for the wet etching. Since the wet etching rate of the passivation film 26 is higher than that of the passivation film 24, the passivation film 26 is etched to a larger extent than the passivation film 24 to form a through-hole 26a. Additionally, the through-hole 24c including a rounded edge portion 24d at an upper edge and having a curved surface is formed in the passivation film 24. The through-hole 24c has a smaller diameter than that of the through-hole 26a and is formed so as to be surrounded by the through-hole 26a. In the present modification, the passivation film 24 is wet-etched via the passivation film 26 on the passivation film 24 having a higher wet etching rate than that of the passivation film 24. For this reason, the through-hole 24c including the edge portion 24d having the curved surface as described above is formed without being blocked by the resist mask 20.

After that, the resist mask 20 is removed by, e.g., ashing or wet treatment using a predetermined drug solution.

The radius of curvature of the edge portion 24d having the curved surface is set to be not less than a quarter of the thickness of the passivation film 24 and not more than the thickness. If the radius of curvature is less than a quarter of the thickness of the passivation film 24, the edge portion is not sufficiently rounded, and the efficacy in inhibiting an electrode material from reaching the surface of the compound semiconductor laminated structure 22 is not sufficient. If the radius of curvature is more than the thickness of the passivation film 24, the opening size at an upper portion of the through-hole 24c is too large, and a desired fine anode electrode cannot be formed. Since the radius of curvature of the edge portion 24d is set to be not less than a quarter of the thickness of the passivation film 24 and not more than the thickness, the efficacy in inhibiting the electrode material from reaching the surface of the compound semiconductor laminated structure 22 can be achieved without affecting the opening size at the upper portion of the through-hole 24c. The passivation film 24 is formed so as to have a thickness of about 40 nm in the present modification, and the radius of curvature of the edge portion 24d is set to, e.g., about 10 nm, a quarter of the thickness of the passivation film 24.

As illustrated in FIG. 18, the anode electrode 25 is formed.

More specifically, a resist mask for forming the anode electrode is first formed. For example, a double-layer resist with an overhang structure suitable for evaporation or lift-off is used here. The resist is applied to the passivation films 26 and 24, and openings for exposing the through-hole 24c of the passivation film 24 are formed. With the above-described process, the resist mask having the openings is formed.

For example, Ni and Au as an electrode material are deposited on the resist mask and in the openings that expose the through-hole 24c of the passivation film 24 by, e.g., evaporation. The thickness of Ni is set to about 80 nm, and the thickness of Au is set to about 300 nm. The resist mask and Ni and Au deposited on the resist mask are removed by lift-off. With the above-described processes, the anode electrode 25 is formed on the passivation film 24 so as to plug the through-hole 24c with a part of Ni. A lower layer portion of the anode electrode 25 is the Ni layer 25a while an upper layer portion is the Au layer 25b.

After steps such as electrical connection of the cathode electrode 23 and anode electrode 25, a GaN-SBD according to the present modification is formed.

As has been described above, according to the present modification, a highly reliable, high-voltage GaN-SBD which inhibits Au as an electrode material from reaching an interface between the anode electrode 25 and the compound semiconductor laminated structure 22 and prevents deterioration in anode characteristics is achieved.

Third Embodiment

The present embodiment discloses a PFC (Power Factor Correction) circuit including one or both of an AlGaN/GaN HEMT fabricated according to the first embodiment or the modification thereof and a GaN-SBD fabricated according to the second embodiment or the modification thereof.

Figure 19:
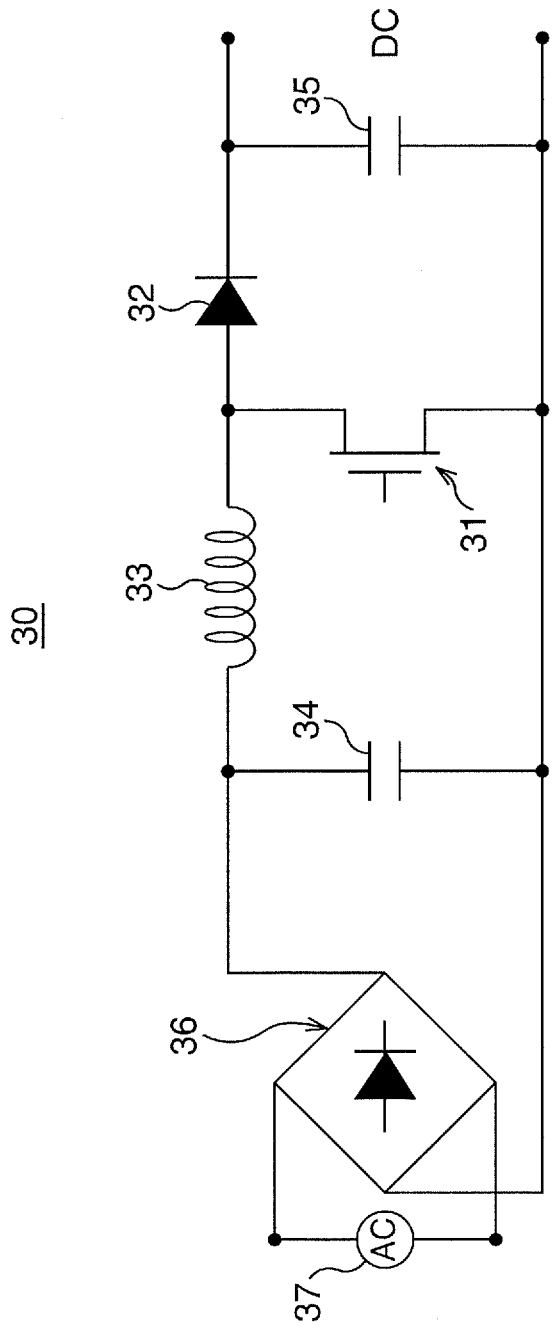
FIG. 19 is a connection diagram illustrating a PFC circuit according to a third embodiment.

FIG. 19 is a connection diagram illustrating the PFC circuit according to the third embodiment.

A PFC circuit 30 includes a switching device (transistor) 31, a diode 32, a choke coil 33, capacitors 34 and 35, a diode bridge 36, and an alternating-current power supply (AC) 37. An AlGaN/GaN HEMT fabricated according to the first embodiment or the modification thereof is applied to the switching device 31. Alternatively, a GaN-SBD fabricated according to the second embodiment or the modification thereof is applied to the diode 32. Alternatively, an AlGaN/GaN HEMT fabricated according to the first embodiment or the modification thereof is applied to the switching device 31, and a GaN-SBD fabricated according to the second embodiment or the modification thereof is applied to the diode 32.

In the PFC circuit 30, a drain electrode of the switching device 31, an anode terminal of the diode 32, and one terminal of the choke coil 33 are connected. A source electrode of the switching device 31, one terminal of the capacitor 34, and one terminal of the capacitor 35 are connected. The other terminal of the capacitor 34 and the other terminal of the choke coil 33 are connected. The other terminal of the capacitor 35 and a cathode terminal of the diode 32 are connected. The AC 37 is connected between the two terminals of the capacitor 34 via the diode bridge 36. A direct-current power supply (DC) is connected between the two terminals of the capacitor 35.

In the present embodiment, a highly reliable, high-voltage AlGaN/GaN HEMT which inhibits Au as an electrode material from reaching an interface between a gate electrode 7 and a compound semiconductor laminated structure 2 and prevents deterioration in gate characteristics is applied to the PFC circuit 30. In addition to or instead of this, a highly reliable, high-voltage GaN-SBD which inhibits Au as an electrode material from reaching an interface between an anode electrode 25 and a compound semiconductor laminated structure 22 and prevents deterioration in anode characteristics is applied to the PFC circuit 30. This configuration achieves the highly reliable PFC circuit 30.

Fourth Embodiment

The present embodiment discloses a power supply unit including one or both of an AlGaN/GaN HEMT fabricated according to the first embodiment or the modification thereof and a GaN-SBD fabricated according to the second embodiment or the modification thereof.

Figure 20:
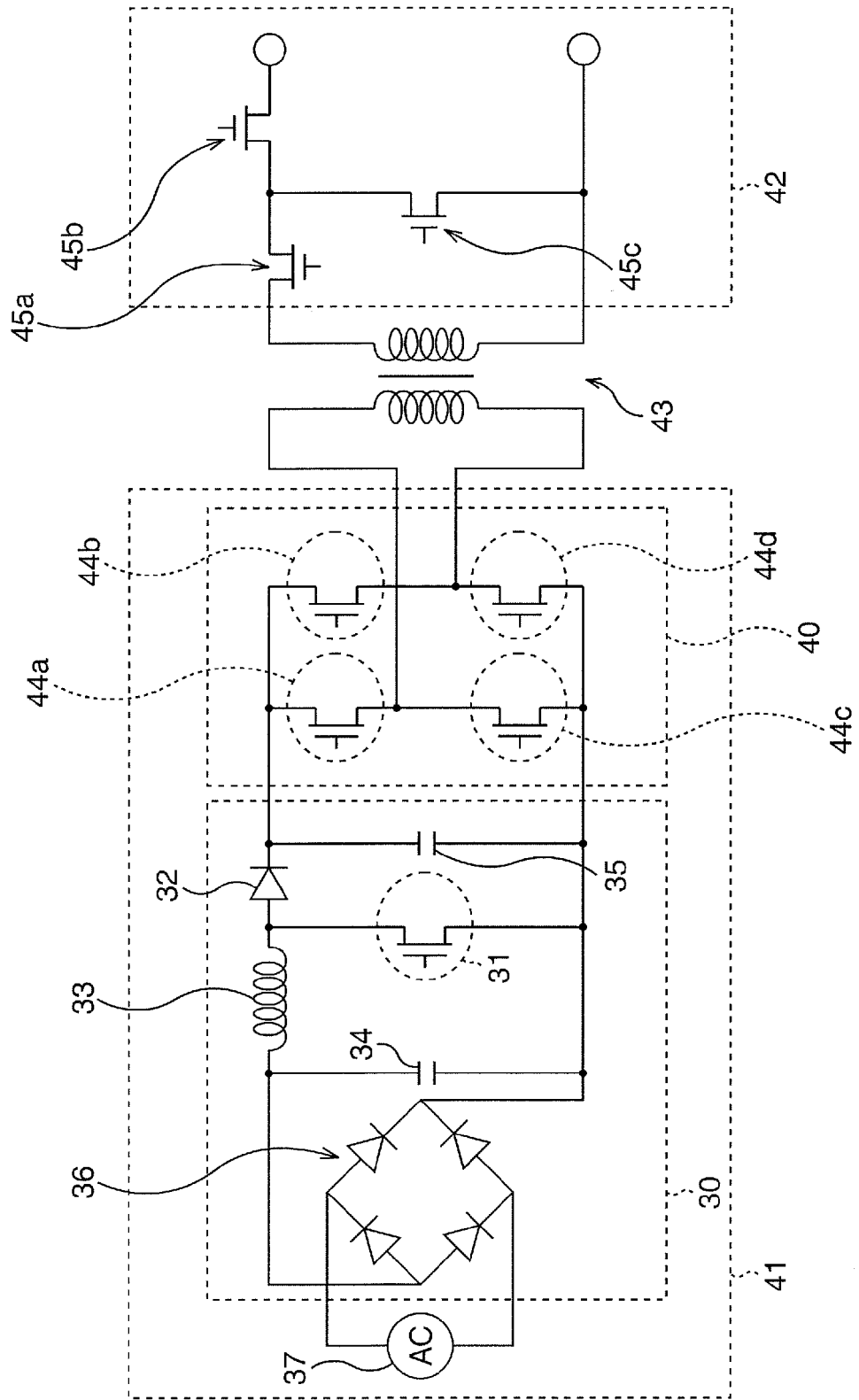
FIG. 20 is a connection diagram illustrating the schematic configuration of a power supply unit according to a fourth embodiment.

FIG. 20 is a connection diagram illustrating the schematic configuration of the power supply unit according to the fourth embodiment.

The power supply unit according to the present embodiment includes a high-voltage primary circuit 41, a low-voltage secondary circuit 42, and a transformer 43 which is disposed between the primary circuit 41 and the secondary circuit 42.

The primary circuit 41 includes a PFC circuit 30 according to the third embodiment and an inverter circuit (e.g., a full bridge inverter circuit 40) which is connected between two terminals of a capacitor 35 of the PFC circuit 30. The full bridge inverter circuit 40 includes a plurality of (four in the present embodiment) switching devices 44a, 44b, 44c, and 44d.

The secondary circuit 42 includes a plurality of (three in the present embodiment) switching devices 45a, 45b, and 45c.

In the present embodiment, an AlGaN/GaN HEMT fabricated according to the first embodiment or the modification thereof is used as each of a switching device 31 of the PFC circuit 30 of the primary circuit 41 and the switching devices 44a, 44b, 44c, and 44d of the full bridge inverter circuit 40. Alternatively, a GaN-SBD fabricated according to the second embodiment or the modification thereof is used as a diode 32 of the PFC circuit 30, and an AlGaN/GaN HEMT fabricated according to the first embodiment or the modification thereof is used as each of the switching devices 44a, 44b, 44c, and 44d of the full bridge inverter circuit 40. Alternatively, an AlGaN/GaN HEMT fabricated according to the first embodiment or the modification thereof is used as each of the switching device 31 of the PFC circuit 30 and the switching devices 44a, 44b, 44c, and 44d of the full bridge inverter circuit 40, and a GaN-SBD fabricated according to the second embodiment or the modification thereof is used as the diode 32 of the PFC circuit 30.

A normal MIS FET using silicon is used as each of the switching devices 45a, 45b, and 45c of the secondary circuit 42.

In the present embodiment, the PFC circuit 30 according to the third embodiment is applied to a power supply unit. This configuration achieves a highly reliable, high-power power supply unit.

Fifth Embodiment

The present embodiment discloses a high-frequency amplifier including an AlGaN/GaN HEMT fabricated according to the first embodiment.

Figure 21:
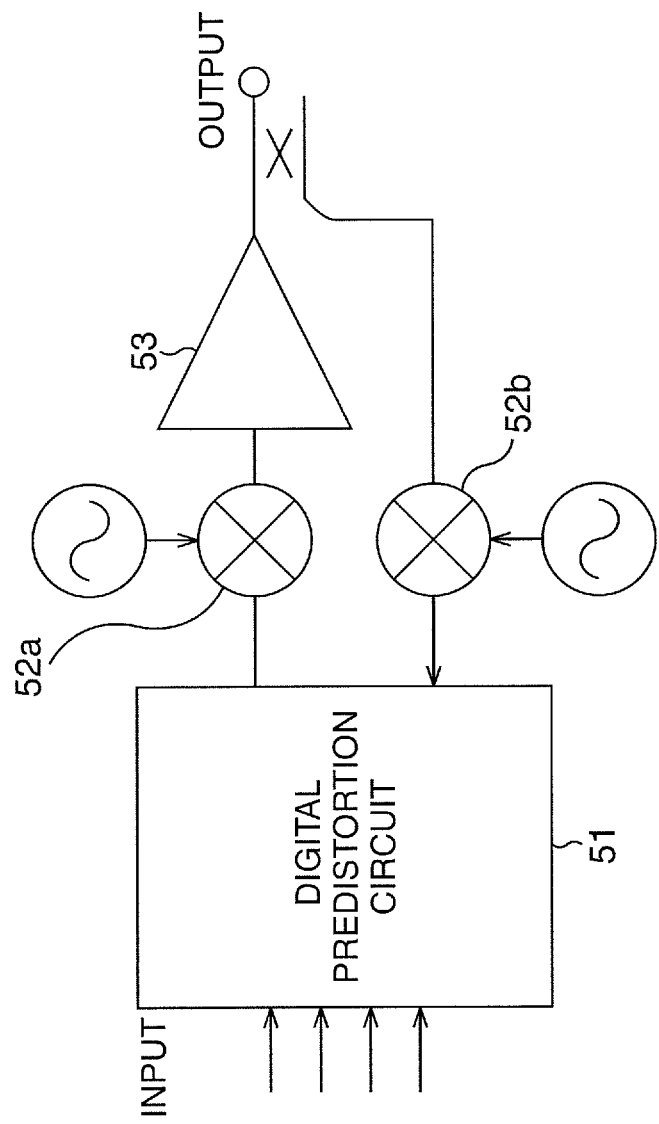
FIG. 21 is a connection diagram illustrating the schematic configuration of a high-frequency amplifier according to a fifth embodiment.

FIG. 21 is a connection diagram illustrating the schematic configuration of the high-frequency amplifier according to the fifth embodiment.

The high-frequency amplifier according to the present embodiment includes a digital predistortion circuit 51, mixers 52a and 52b, and a power amplifier 53.

The digital predistortion circuit 51 is intended to compensate for nonlinear distortion of an input signal. The mixer 52a is intended to mix the input signal whose nonlinear distortion has been compensated for and an AC signal. The power amplifier 53 is intended to amplify the input signal mixed with the AC signal and includes an AlGaN/GaN HEMT according to the first embodiment or the modification thereof. Note that the high-frequency amplifier in FIG. 21 is configured so as to be capable of mixing a signal on the output side with an AC signal in the mixer 52b and sending out the mixed signal to the digital predistortion circuit 51 by, e.g., flipping a switch.

In the present embodiment, a highly reliable, high-voltage AlGaN/GaN HEMT which inhibits Au as an electrode material from reaching an interface between a gate electrode 7 and a compound semiconductor laminated structure 2 and prevents deterioration in gate characteristics is applied to a high-frequency amplifier. This configuration achieves a highly reliable, high-voltage high-frequency amplifier.

Application of a high-frequency amplifier according to the present embodiment to a transmission and reception module allows provision of more reliable communication and more reliable system equipment such as a radar, a sensor, or an interference unit.

Other Embodiments

The first embodiment, the modification thereof, and the third to fifth embodiments illustrate an AlGaN/GaN HEMT as a compound semiconductor device. The embodiments can be applied to the HEMTs below as a compound semiconductor device, in addition to an AlGaN/GaN HEMT.

Another HEMT

Example 1

The present example discloses an InAlN/GaN HEMT as a compound semiconductor device. InAlN and GaN are compound semiconductors whose lattice constants can be made closer to each other by changing the composition. In the first and third to fifth embodiments described above, an electron transit layer is formed from i-GaN, an intermediate layer is formed from AlN, an electron supply layer is formed from n-InAlN, and a cap layer is formed from n-GaN. Since piezoelectric polarization hardly occurs in this case, two-dimensional electron gas is generated mainly due to spontaneous polarization of InAlN.

According to the present example, a highly reliable, high-voltage InAlN/GaN HEMT which inhibits Au as an electrode material from reaching an interface between a gate electrode and a compound semiconductor laminated structure and prevents deterioration in gate characteristics is achieved, like the above-described AlGaN/GaN HEMTs.

Another HEMT

Example 2

The present example discloses an InAlGaN/GaN HEMT as a compound semiconductor device.

GaN and InAlGaN are compound semiconductors, and the lattice constant of the latter can be made lower than that of the former by changing the composition. In the first and third to fifth embodiments, an electron transit layer is formed from i-GaN, an intermediate layer is formed from i-InAlGaN, an electron supply layer is formed from n-InAlGaN, and a cap layer is formed from n-GaN.

According to the present example, a highly reliable, high-voltage InAlGaN/GaN HEMT which inhibits Au as an electrode material from reaching an interface between a gate electrode and a compound semiconductor laminated structure and prevents deterioration in gate characteristics is achieved, like the above-described AlGaN/GaN HEMTs.

According to the above-described embodiments, a highly reliably, high-voltage compound semiconductor device which inhibits an electrode material from reaching an interface between an electrode and a compound semiconductor layer and prevents deterioration in gate characteristics is achieved.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A compound semiconductor device, comprising:
   a compound semiconductor layer;
   an insulating film formed on the compound semiconductor layer and comprising a through-hole; and
   an electrode formed on the insulating film so as to plug the through-hole,
   wherein a grain boundary between different crystalline orientations is formed in the electrode, and an end of the grain boundary is spaced apart from the through-hole on a flat surface of the insulating film.

2. The compound semiconductor device according to claim 1, wherein an edge of the through-hole in the insulating film has a curved surface.

3. The compound semiconductor device according to claim 2, wherein a radius of curvature of the curved surface at the edge of the through-hole in the insulating film is not less than a quarter of thickness of the insulating film and not more than the thickness.

4. The compound semiconductor device according to claim 1, wherein a protective film made of a material comprising a wet etching rate higher than a wet etching rate of the insulating film is formed on the insulating film so as to surround the through-hole.

5. The compound semiconductor device according to claim 1, wherein the grain boundary is an interface between a portion which has a face-centered cubic (111) orientation and a portion which is located on the flat surface of the insulating film and has a random orientation.

6. The compound semiconductor device according to claim 1, wherein the insulating film is a single-layer film made of one selected from a group consisting of a silicon nitride, a silicon oxide, a silicon oxynitride, and an aluminum oxide or a laminated film made of any two or more selected from the group.

7. The compound semiconductor device according to claim 1, wherein the electrode is a gate electrode.

8. The compound semiconductor device according to claim 1, wherein the electrode is an anode electrode.

* * * * *